US010736228B2

(12) United States Patent
Kho et al.

(10) Patent No.: US 10,736,228 B2
(45) Date of Patent: Aug. 4, 2020

(54) REMOVEABLE DRIVE-PLANE APPARATUS, SYSTEM, AND METHOD

(71) Applicant: Facebook, Inc., Menlo Park, CA (US)

(72) Inventors: Chuankeat Kho, San Jose, CA (US); Jason David Adrian, San Jose, CA (US)

(73) Assignee: Facebook, Inc., Menlo Park, CA (US)

(*) Notice: Subject to any disclaimer, the term of this patent is extended or adjusted under 35 U.S.C. 154(b) by 414 days.

(21) Appl. No.: 15/693,362

(22) Filed: Aug. 31, 2017

(65) Prior Publication Data
US 2019/0069432 A1 Feb. 28, 2019

(51) Int. Cl.
H05K 7/14 (2006.01)
G11B 33/12 (2006.01)
G11B 33/14 (2006.01)

(52) U.S. Cl.
CPC ......... H05K 7/1489 (2013.01); G11B 33/126 (2013.01); G11B 33/128 (2013.01); G11B 33/142 (2013.01); H05K 7/1487 (2013.01); H05K 7/1492 (2013.01); H05K 7/1439 (2013.01)

(58) Field of Classification Search
CPC ............ H05K 7/1489; H05K 7/20727; H05K 5/0021; H05K 5/0028; H05K 7/1409; H05K 7/1492; H05K 7/1487; H05K 7/1439; G06F 12/1466; G11B 33/128; G11B 33/142; G11B 33/126
USPC ............ 361/679.01, 679.02, 679.31–679.33, 361/679.37–679.39, 679.4, 679.48, 361/679.58, 724–726, 729–733, 740, 742, 361/747, 759
See application file for complete search history.

(56) References Cited

U.S. PATENT DOCUMENTS

| | | | |
|---|---|---|---|
| 355,538 A | 1/1887 | Keyes | |
| 517,703 A | 4/1894 | Ludwig | |
| 922,852 A | 5/1909 | Cannan | |
| 1,062,733 A | 5/1913 | Rahotina | |
| 1,516,692 A | 11/1924 | Andreas | |
| 1,777,074 A | 9/1930 | Cordrey | |
| 3,447,850 A | 6/1969 | Samson | |
| 3,536,348 A | 10/1970 | Tedesco | |
| 3,601,463 A | 8/1971 | Watt | |
| 3,711,140 A | 1/1973 | Onori | |

(Continued)

OTHER PUBLICATIONS

Acoustic Attenuation; https://en.wikipedia.org/wiki/Acoustic_attenuation; Oct. 22, 2012.

(Continued)

Primary Examiner — Jayprakash N Gandhi
Assistant Examiner — Stephen S Sul
(74) Attorney, Agent, or Firm — FisherBroyles, LLP

(57) ABSTRACT

A removeable drive-plane board may include (1) keyhole openings that are configured to interlock with keyhole fasteners of a retaining member of a storage-system chassis, (2) storage-drive connectors, (3) a storage-system module connector, and (4) electrical interconnects that electrically couple the storage-drive connectors to the storage-system module connector. In some examples, the keyhole fasteners of the retaining member may be oriented downward relative to the storage-system chassis. Various other removeable drive-plane apparatus, systems, and methods are also disclosed.

20 Claims, 16 Drawing Sheets

(56) References Cited

U.S. PATENT DOCUMENTS

| | | |
|---|---|---|
| 3,996,500 A | 12/1976 | Coules |
| D294,800 S | 3/1988 | Nilsson |
| 4,969,065 A | 11/1990 | Petri |
| 4,993,762 A | 2/1991 | Rogers et al. |
| 5,262,705 A | 11/1993 | Hattori |
| 5,281,149 A | 1/1994 | Petri |
| 5,724,803 A | 3/1998 | Pea |
| 5,793,614 A | 8/1998 | Tollbom |
| 5,957,659 A | 9/1999 | Amou |
| 6,021,044 A | 2/2000 | Neville, Jr. et al. |
| 6,109,767 A | 8/2000 | Rodriguez |
| 6,116,375 A | 9/2000 | Lorch |
| 6,159,031 A | 12/2000 | Llapitan |
| 6,181,549 B1 | 1/2001 | Mills |
| 6,259,032 B1 * | 7/2001 | Fernandez ............... H01R 4/64 174/138 E |
| 6,260,441 B1 * | 7/2001 | Landl ................... A63C 11/06 451/558 |
| 6,331,915 B1 | 12/2001 | Myers |
| 6,373,707 B1 | 4/2002 | Hutchins |
| 6,385,036 B1 | 5/2002 | Chien |
| 6,385,051 B1 | 5/2002 | Perez et al. |
| 6,404,646 B1 | 6/2002 | Tsai |
| 6,469,899 B2 | 10/2002 | Hastings |
| 6,515,854 B1 | 2/2003 | Claprood |
| 6,535,394 B1 * | 3/2003 | Hirzmann ............... H05K 7/142 174/138 E |
| 6,552,915 B2 | 4/2003 | Takahashi et al. |
| 6,556,433 B1 * | 4/2003 | Love ...................... G06F 1/184 312/223.2 |
| 6,621,692 B1 | 9/2003 | Johnson |
| 6,695,629 B1 | 2/2004 | Mayer |
| 6,791,843 B1 | 9/2004 | Dobbs |
| 6,798,669 B1 | 9/2004 | Hsu |
| 6,813,165 B2 | 11/2004 | Cheng |
| 6,921,227 B1 | 7/2005 | De Jong et al. |
| 6,987,674 B2 | 1/2006 | El-Batal |
| 6,992,885 B2 * | 1/2006 | Wang ................... G11B 33/142 312/107 |
| 6,995,982 B2 | 2/2006 | Gonzalez |
| 7,004,764 B2 | 2/2006 | Boudreau |
| 7,084,654 B2 | 8/2006 | Zhao |
| 7,085,131 B2 | 8/2006 | Peng et al. |
| 7,088,579 B1 | 8/2006 | Konshak |
| 7,167,371 B2 | 1/2007 | Coles |
| 7,301,778 B1 | 11/2007 | Fang |
| 7,304,855 B1 | 12/2007 | Milligan et al. |
| 7,408,770 B2 | 8/2008 | Peng et al. |
| 7,411,787 B2 | 8/2008 | Katakura |
| 7,423,354 B2 | 9/2008 | Suzuki et al. |
| 7,505,286 B2 | 3/2009 | Brovald |
| 7,515,413 B1 | 4/2009 | Curtis |
| 7,649,750 B2 | 1/2010 | Lee |
| 7,826,208 B2 | 11/2010 | Wang et al. |
| 8,020,902 B1 | 9/2011 | Li |
| 8,127,059 B1 | 2/2012 | Carr et al. |
| 8,203,851 B2 | 6/2012 | Boetzer |
| 8,310,828 B2 | 11/2012 | Collins |
| 8,331,095 B2 | 12/2012 | Hu et al. |
| 8,369,080 B2 | 2/2013 | Huang |
| 8,517,054 B2 | 8/2013 | Lai et al. |
| 8,570,720 B2 | 10/2013 | Yao |
| 8,636,528 B2 | 1/2014 | Sass et al. |
| 8,657,619 B2 | 2/2014 | Lin |
| 8,743,549 B2 | 6/2014 | Frink et al. |
| 8,749,966 B1 | 6/2014 | Boudreau |
| 8,770,681 B2 | 7/2014 | Hu |
| 8,848,349 B2 | 9/2014 | Ke |
| 8,944,538 B2 | 2/2015 | Li |
| 8,971,052 B2 | 3/2015 | Fu |
| 9,066,438 B2 | 6/2015 | Chen |
| 9,070,419 B1 | 6/2015 | Zhu |
| 9,098,233 B2 | 8/2015 | Keffeler |
| 9,101,210 B2 | 8/2015 | Lin |
| 9,203,188 B1 | 12/2015 | Siechen |
| 9,274,548 B2 | 3/2016 | Foisy et al. |
| 9,298,230 B2 | 3/2016 | Wei |
| 9,313,909 B1 | 4/2016 | Huang |
| 9,354,003 B2 | 5/2016 | Lin |
| 9,448,601 B1 | 9/2016 | Beall et al. |
| 9,454,190 B2 | 9/2016 | Mao et al. |
| 9,456,519 B2 | 9/2016 | Bailey |
| 9,461,389 B2 | 10/2016 | Novack |
| 9,474,190 B1 * | 10/2016 | Beall ................. H05K 7/20727 |
| 9,538,684 B2 | 1/2017 | Chen |
| 9,545,028 B2 | 1/2017 | Hoshino |
| 9,572,276 B2 | 2/2017 | Haroun |
| 9,583,877 B1 | 2/2017 | Angelucci |
| 9,609,778 B1 | 3/2017 | Spencer |
| 9,763,350 B2 | 9/2017 | Rust |
| 9,763,353 B1 | 9/2017 | Beall |
| 9,795,052 B2 | 10/2017 | Hsiao |
| 9,936,611 B1 | 4/2018 | Beall et al. |
| 9,949,407 B1 | 4/2018 | Beall |
| 10,058,006 B2 | 8/2018 | Hung et al. |
| 10,165,703 B1 | 12/2018 | Adrian |
| 10,178,791 B1 | 1/2019 | Kho |
| 10,240,615 B1 | 3/2019 | Kho et al. |
| 10,264,698 B2 | 4/2019 | Kho et al. |
| 10,354,699 B1 * | 7/2019 | Gopalakrishna ........ G06F 1/181 |
| 10,372,360 B2 | 8/2019 | Adrian |
| 2003/0112594 A1 * | 6/2003 | Smith .................... G06F 1/183 361/679.02 |
| 2003/0123221 A1 | 7/2003 | Liao |
| 2003/0183448 A1 | 10/2003 | Van Sleet |
| 2003/0200472 A1 | 10/2003 | Midorikawa et al. |
| 2003/0200475 A1 | 10/2003 | Komoto |
| 2004/0052046 A1 * | 3/2004 | Regimbal ............... G06F 1/184 361/679.33 |
| 2004/0227443 A1 | 11/2004 | Sandoval |
| 2005/0057909 A1 | 3/2005 | El-Batal et al. |
| 2005/0136747 A1 | 6/2005 | Caveney et al. |
| 2005/0162099 A1 | 7/2005 | Kemper |
| 2005/0182874 A1 | 8/2005 | Herz et al. |
| 2005/0238421 A1 | 10/2005 | Doerr |
| 2006/0075155 A1 | 4/2006 | Fuller et al. |
| 2006/0134953 A1 | 6/2006 | Williams |
| 2006/0146507 A1 | 7/2006 | Lee |
| 2006/0198097 A1 * | 9/2006 | Kuwajima ............. H04N 5/775 361/679.21 |
| 2006/0274508 A1 | 12/2006 | LaRiviere |
| 2007/0195542 A1 | 8/2007 | Metros |
| 2007/0230111 A1 | 10/2007 | Starr |
| 2007/0233781 A1 | 10/2007 | Starr |
| 2007/0234081 A1 | 10/2007 | Makino et al. |
| 2008/0007913 A1 | 1/2008 | Tavassoli Kamran |
| 2008/0117569 A1 | 5/2008 | Lee |
| 2008/0174949 A1 | 7/2008 | Lai et al. |
| 2008/0195786 A1 | 8/2008 | Lee |
| 2008/0239650 A1 * | 10/2008 | Fujie ...................... G06F 1/187 361/679.35 |
| 2008/0264192 A1 | 10/2008 | Christensen |
| 2009/0245745 A1 | 10/2009 | Krampotich |
| 2009/0271950 A1 | 11/2009 | Wang |
| 2009/0274429 A1 | 11/2009 | Krampotich |
| 2009/0310303 A1 | 12/2009 | Najbert |
| 2010/0153608 A1 * | 6/2010 | Olesiewicz .......... H05K 7/1487 710/303 |
| 2010/0195304 A1 | 8/2010 | Takao |
| 2010/0296791 A1 | 11/2010 | Makrides-Saravanos |
| 2011/0208937 A1 | 8/2011 | Hayashi et al. |
| 2011/0273850 A1 | 11/2011 | Chen |
| 2011/0299237 A1 | 12/2011 | Liang |
| 2011/0309730 A1 | 12/2011 | Retchloff |
| 2012/0004772 A1 | 1/2012 | Rahilly |
| 2012/0020006 A1 | 1/2012 | Xu |
| 2012/0134086 A1 | 5/2012 | Zhang |
| 2012/0230815 A1 | 9/2012 | Teramoto |
| 2012/0243170 A1 * | 9/2012 | Frink ..................... G06F 1/187 361/679.34 |
| 2012/0257360 A1 | 10/2012 | Sun |
| 2012/0305745 A1 | 12/2012 | Chen |
| 2012/0320519 A1 | 12/2012 | Wu et al. |

(56) References Cited

U.S. PATENT DOCUMENTS

| | | |
|---|---|---|
| 2013/0050955 A1 | 2/2013 | Shinsato et al. |
| 2013/0058054 A1 | 3/2013 | Zhou |
| 2013/0162127 A1 | 6/2013 | Hu |
| 2013/0258580 A1 | 10/2013 | Nakayama |
| 2013/0325183 A1 | 12/2013 | Rahilly |
| 2014/0111930 A1 | 4/2014 | Henderson |
| 2014/0118936 A1 | 5/2014 | Merlet et al. |
| 2014/0187068 A1 | 7/2014 | Chia |
| 2014/0191636 A1 | 7/2014 | Li |
| 2014/0203696 A1 | 7/2014 | Rust et al. |
| 2014/0247569 A1* | 9/2014 | Foisy ................ G06F 1/16 361/759 |
| 2014/0362521 A1 | 12/2014 | Pronozuk et al. |
| 2014/0369002 A1 | 12/2014 | Takeuchi |
| 2015/0156912 A1 | 6/2015 | Liang |
| 2015/0163946 A1 | 6/2015 | Kyle |
| 2015/0208548 A1 | 7/2015 | Chu |
| 2015/0235673 A1 | 8/2015 | Lo |
| 2015/0320204 A1* | 11/2015 | Byrne ................ H02G 3/123 361/807 |
| 2015/0380059 A1 | 12/2015 | Bell et al. |
| 2016/0018859 A1 | 1/2016 | Mao et al. |
| 2016/0042768 A1 | 2/2016 | Yang et al. |
| 2016/0150659 A1 | 5/2016 | Chen |
| 2016/0150667 A1 | 5/2016 | Xu |
| 2016/0330858 A1 | 11/2016 | Ehlen |
| 2016/0381824 A1* | 12/2016 | Chu ................ H05K 7/1487 361/679.32 |
| 2017/0325361 A1 | 11/2017 | Chen et al. |
| 2018/0027059 A1 | 1/2018 | Miller |
| 2018/0168071 A1 | 6/2018 | Edge et al. |
| 2018/0260349 A1 | 9/2018 | Mondal et al. |
| 2019/0069432 A1 | 2/2019 | Kho et al. |
| 2019/0069437 A1 | 2/2019 | Adrian et al. |
| 2019/0069440 A1 | 2/2019 | Adrian |
| 2019/0073008 A1 | 3/2019 | Adrian |
| 2019/0075668 A1 | 3/2019 | Adrian et al. |
| 2019/0079565 A1 | 3/2019 | Adrian |
| 2019/0090374 A1 | 3/2019 | Kho et al. |
| 2019/0090376 A1 | 3/2019 | Kho et al. |
| 2019/0098795 A1 | 3/2019 | Adrian |

OTHER PUBLICATIONS

Electromagnetic Shielding; https://en.wikipedia.org/wiki/Electromagnetic_shielding; May 15, 2016.

Jason David Adrian et al.; Apparatus, System, and Method for Reconfigurable Media-Agnostic Storage; U.S. Appl. No. 15/694,068, filed Sep. 1, 2017.

Jason David Adrian; Apparatus, System, and Method for Indicating the Status of and Securing Hard Drives; U.S. Appl. No. 15/700,112, filed Sep. 9, 2017.

Jason David Adrian; Apparatus, System, and Method for Directing Air in a Storage-System Chassis; U.S. Appl. No. 15/689,650, filed Aug. 29, 2017.

Jason David Adrian et al.; Apparatus, System, and Method for Enabling Multiple Storage-System Configurations; U.S. Appl. No. 15/688,830, filed Aug. 28, 2017.

Jason David Adrian et al.; Apparatus, System, and Method for Securing Hard Drives in a Storage Chassis; U.S. Appl. No. 15/697,405, filed Sep. 6, 2017.

Jason David Adrian; Apparatus, System, and Method for Detecting Device Types of Storage Devices; U.S. Appl. No. 15/698,540, filed Sep. 7, 2017.

Chuankeat Kho et al.; Systems and Methods for Mounting Assembly Pull-Handles; U.S. Appl. No. 15/687,406, filed Aug. 25, 2017.

Jason David Adrian; An Apparatus, System, and Method for Reconfiguring Air Flow Through a Chassis; U.S. Appl. No. 15/716,251, filed Sep. 26, 2017.

Jason Adrian; Introducing Bryce Canyon: Our next-generation storage platform; https://code.facebook.com/posts/1869788206569924/introducing-bryce-canyon-our-next-generation-storage-platform/; Mar. 8, 2017.

Jason Adrian et al.; Bryce Canyon Storage Specification; Jan. 31, 2017.

Open Compute Project; http://opencompute.org/; as accessed Sep. 29, 2017.

Jason David Adrian; Data-Center Drawer and Cable Track Assembly; U.S. Appl. No. 15/720,647, filed Sep. 29, 2017.

Bisson; How Facebook Does Storage; https://thenewstack.io/facebook-storage.

What's the Difference Between SATA and SAS Hard Drives?; https://www.pickaweb.co.uk/kb/difference-between-sata-sas-hard-drives/.

Chuankeat Kho; Apparatus, System, and Method for Securing Computing Components to Printed Circuit Boards; U.S. Appl. No. 15/713,607, filed Sep. 23, 2017.

Chuankeat Kho et al.; Apparatus, System, and Method for Partitioning a Storage-System Chassis; U.S. Appl. No. 15/708,069, filed Sep. 18, 2017.

Chuankeat Kho et al.; Apparatus, System, and Method for Dampening Vibrations Generated by Exhaust Fans; U.S. Appl. No. 15/713,609, filed Sep. 23, 2017.

Chuankeat Kho et al.; Apparatus, System, and Method for Resisting Shock to a Data-Center Rack; U.S. Appl. No. 15/708,075, filed Sep. 18, 2017.

* cited by examiner

REMOVEABLE DRIVE-PLANE APPARATUS, SYSTEM, AND METHOD

BACKGROUND

Today, many entities create and manage complex data centers capable of storing and accessing hundreds of terabytes of data (e.g., text, image, and video data) that are generated and consumed every day by their users. These complex data centers often need to be capable of creating and storing duplicate copies of this data for disaster-recovery, testing, regulatory, or other purposes. To cope with these storage needs, existing data storage centers often have hundreds or thousands of petabytes of storage capacity.

As the need for storage capacity increases, storage-system providers have attempted to meet these needs with storage systems having higher levels of storage density. In some cases, high-density storage systems simply have more storage drives packed into their chassis than their lower-density storage-system counterparts. Conventional storage systems may be housed within rack-mounted chassis and may be made up of various components that may fail. While many conventional storage systems are designed so that some of their components, such as storage drives, may be easily removed from the storage system's chassis and replaced when they fail, many conventional storage systems have been designed such that some components, such as storage-drive connectors and electrical connections, are impossible or impractical to remove or replace in a timely fashion.

SUMMARY

As will be described in greater detail below, the instant disclosure describes various apparatus, systems, and methods that enable drive-plane boards to be easily removed from storage-system chassis. In one example, a removeable drive-plane board may include (1) keyhole openings that are configured to interlock with keyhole fasteners of a retaining member of a storage-system chassis, (2) storage-drive connectors, (3) a storage-system module connector, and (4) electrical interconnects that electrically couple the storage-drive connector to the storage-system module connector. In some examples, the keyhole fasteners of the retaining member may be oriented downward relative to the storage-system chassis.

In some examples, the retaining member may further include a fastener-retaining member, and the removeable drive-plane board may further include an opening configured to accept a fastener that is configured to (1) removably engage the fastener-retaining member of the retaining member and (2) secure the removable drive-plane board to the retaining member when the keyhole openings of the removable drive-plane board are interlocked with the keyhole fasteners of the retaining member. In at least one example, the fastener-retaining member is a screw thread insert countersunk into the retaining member, and the fastener comprises a screw having a hand knob.

In some examples, the keyhole openings of the removable drive-plane board may be oriented to enable (1) rearward disengagement of the keyhole openings of the removable drive-plane board from the keyhole fasteners of the retaining member and (2) forward engagement of the keyhole openings of the removable drive-plane board with the keyhole fasteners of the retaining member. In at least one example, the removeable drive-plane board may further include (1) a front drive section located on a top side of the removable drive-plane board that includes a front portion of the storage-drive connectors, (2) a rear drive section located on the top of the removable drive-plane board that includes a rear portion of the storage-drive connectors, (3) an opening located between the front drive section and the rear drive section that allows air to flow from below the removable drive-plane board to above the removable drive-plane board, and (4) an air baffle configured to direct a portion of an airflow through the opening from below the removable drive-plane board to above the removable drive-plane board. In some examples, the air baffle may include two or more fingerholds that enable a technician to grasp and remove the removable drive-plane board from the storage-system chassis by sliding the removable drive-plane board backward such that the keyhole openings of the removable drive-plane board disengage from the keyhole fasteners of the retaining member.

In some examples, the removable drive-plane board may further include (1) a front printed circuit board that includes the front drive section and (2) a rear printed circuit board coupled to the front printed circuit board that includes the rear drive section. In such examples, the opening may be a gap located between the front printed circuit board and the rear printed circuit board, and the air baffle may be (1) composed of rigid plastic, (2) coupled to the front printed circuit board and the rear printed circuit board, and (3) configured to rigidly tie the front printed circuit board to the rear printed circuit board. In certain examples, the retaining member may be a multi-purpose storage-system partition configured to retain a plurality of carrierless storage drives within the storage-system chassis.

According to various embodiments, a corresponding storage-system drawer may include (1) a chassis having a front, a left side, a right side, and a rear, (2) a retaining member that includes keyhole fasteners that are oriented downward relative to the chassis, and (3) a removeable drive-plane board that includes (a) keyhole openings that are configured to interlock with the keyhole fasteners of the retaining member, (b) storage-drive connectors, (c) a storage-system module connector, and (d) electrical interconnects that electrically couple the storage-drive connectors to the storage-system module connector. In some examples, the retaining member may further include a fastener-retaining member, and the storage-system drawer may further include a fastener configured to removably engage the fastener-retaining member of the retaining member and secure the removable drive-plane board to the retaining member when the keyhole openings of the removable drive-plane board are interlocked with the keyhole fasteners of the retaining member. In at least one example, the fastener-retaining member may be a screw thread insert countersunk into the retaining member, and the fastener may be a screw having a hand knob.

In some examples, the keyhole openings of the removable drive-plane board may be oriented to enable (1) rearward disengagement of the keyhole openings of the removable drive-plane board from the keyhole fasteners of the retaining member and (2) forward engagement of the keyhole openings of the removable drive-plane board with the keyhole fasteners of the retaining member. In certain examples, the rear of the chassis may include an additional retaining member configured to retain a rear edge of the removable drive-plane board when the keyhole openings of the removable drive-plane board are disengaged from the keyhole fasteners of the retaining member. Additionally or alternatively, the rear of the chassis may include an additional retaining member configured to position a rear edge of the removable drive-plane board such that the keyhole openings of the removable drive-plane board can receive the keyhole fasteners of the retaining member. In certain examples, the retaining member may be a multi-purpose storage-system partition configured to retain a plurality of carrierless storage drives within the chassis.

In some examples, the removable drive-plane board may include (1) a front drive section located on a top side of the removable drive-plane board that includes a front portion of the storage-drive connectors, (2) a rear drive section located on the top of the removable drive-plane board that includes a rear portion of the storage-drive connectors, (3) an opening located between the front drive section and the rear drive section that allows air to flow from below the removable drive-plane board to above the removable drive-plane board, and (4) an air baffle configured to direct a portion of an airflow through the opening from below the removable drive-plane board to above the removable drive-plane board. In at least one example, the removable drive-plane board may include a front printed circuit board that includes the front drive section and a rear printed circuit board coupled to the front printed circuit board that includes the rear drive section. In such examples, the opening may be a gap located between the front printed circuit board and the rear printed circuit board and the air baffle may be (1) made of rigid plastic, (2) coupled to the front printed circuit board and the rear printed circuit board, and (3) configured to rigidly tie the front printed circuit board to the rear printed circuit board.

In addition to the various removeable drive-plane apparatus and systems described herein, the instant disclosure presents exemplary methods for removing drive-plane boards from storage-system chassis. For example, a method may include pulling out a storage-system drawer from a data-center rack. The storage-system drawer may include (1) a chassis having a front, a left side, a right side, and a rear, (2) a retaining member coupled to the chassis that includes (a) keyhole fasteners that are oriented downward relative to the chassis and (b) a screw thread insert countersunk into the retaining member, and (3) a removeable drive-plane board that includes (a) keyhole openings that are interlocked with the keyhole fasteners of the retaining member, (b) a storage-drive connector that connects a storage drive to the removeable drive-plane board, (c) a storage-system module connector that connects a storage-system module to the removeable drive-plane board, (d) electrical interconnects that electrically couple the storage-drive connector to the storage-system module connector, and (e) an opening through which a screw having a hand knob is removably engaging the screw thread insert of the retaining member and securing the removable drive-plane board to the retaining member. In some examples, the method may further include unseating the storage drive from the storage-drive connector, unseating the storage-system module from the storage-system module connector, toollessly unscrewing the screw from the screw thread insert of the retaining member, sliding the removable drive-plane board so that each of the keyhole fasteners of the retaining member disengages each of the keyhole openings of the removable drive-plane board, and removing the removable drive-plane board from the chassis.

In some examples, the rear of the chassis may include an additional retaining member configured to retain a rear edge of the removable drive-plane board when the keyhole openings of the removable drive-plane board are disengaged from the keyhole fasteners of the retaining member, the step of sliding the removable drive-plane board may include sliding the removable drive-plane board rearward relative to the chassis until the rear edge of the removable drive-plane board contacts the additional retaining member, and the step of removing the removable drive-plane board from the chassis may include lowering a front edge of the removable drive-plane board until the keyhole fasteners of the retaining member are clear of the keyhole openings of the removable drive-plane board. In at least one example, the method may further include (1) aligning keyhole openings of a replacement drive-plane board with the keyhole fasteners of the retaining member, (2) lifting the replacement drive-plane board until the keyhole fasteners of the retaining member are inserted into the keyhole openings of the replacement drive-plane board, (3) sliding the replacement drive-plane board forward relative to the chassis until the keyhole openings of the replacement-drive board are interlocked with the keyhole fasteners of the retaining member, (4) screwing the screw into the screw thread insert of the retaining member, (5) seating the storage drive to a storage-drive connector of the replacement drive-plane board, (6) seating the storage-system module to a storage-system module connector of the replacement drive-plane board, and (7) pushing the storage-system drawer back into the data-center rack.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
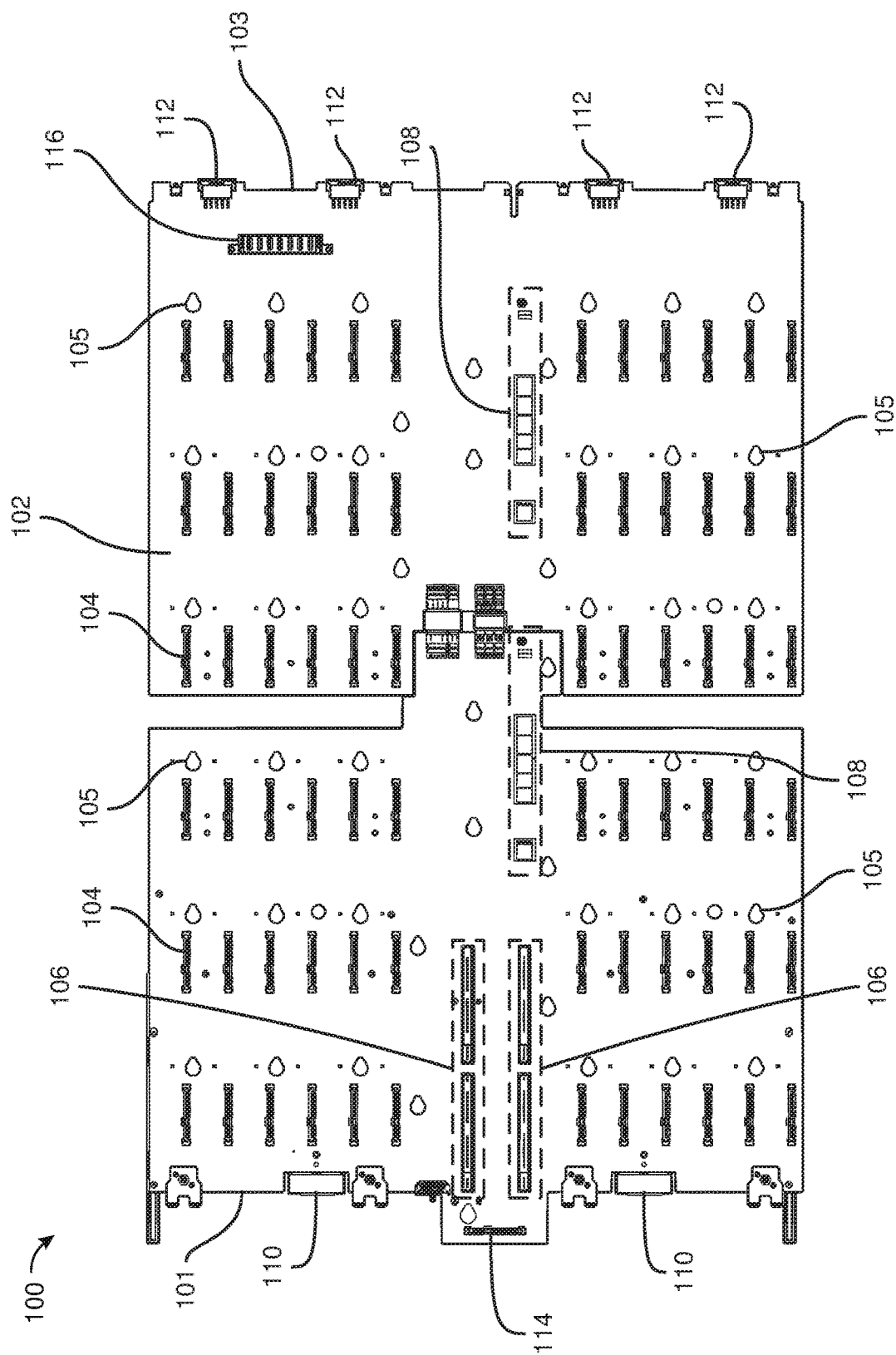
FIG. 1 is a top view of an exemplary drive-plane board.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure is generally directed to removeable drive-plane apparatus, systems, and methods. As will be explained in greater detail below, embodiments of the instant disclosure may enable a removable drive-plane board to be easily removed from a storage-system drawer. In some examples, embodiments of the instant disclosure may enable toolless replacement of the removable drive-plane board. In some examples, the removable drive-plane board may include keyhole openings that are configured to easily interlock and disengage with keyhole fasteners of the storage-system drawer, and thumbscrews with hand knobs may be used to hold the removable drive-plane board in place within the storage-system drawer. Additionally or alternatively, the storage-system drawer may include various toolless latches for unseating storage drives and modules from the removable drive-plane board. In some examples, a bracket at the back of the storage-system drawer may protect a technician from sliding the removable drive-plane board too far back during removal.

The following will provide, with reference to FIGS. 1-4, detailed descriptions of an example removable drive-plane board. Detailed descriptions of an example storage-system drawer will be provided in connection with FIGS. 5-7. Detailed descriptions of an example method for removing a drive-plane board from a storage-system drawer will be provided in connection with FIGS. 8-12. Detailed descriptions of an example multi-purpose storage-system partition will be provided in connection with FIG. 13. Detailed descriptions of an example method for installing a drive-plane board in a storage-system drawer will be provided in connection with FIGS. 14-16.

FIG. 1 shows a top view of an example removable drive-plane board 100. Drive-plane board 100 generally represents any structure that is adapted to connect the various active components (e.g., compute modules, storage drives, storage-controller modules, and input/output modules) that make up a storage system and/or secure the components within a chassis. In some examples, drive-plane board 100 may be one or more printed circuit boards (PCBs) that include various connectors that are electrically connected by conductive traces. In some examples, drive-plane board 100 may be configured to support up to 72 storage drives, up to four fans, drive power control, sensors (e.g., temperature sensors or drawer open sensors), and power distribution.

As shown in FIG. 1, drive-plane board 100 may have a front edge 101, a rear edge 103, and a top 102 on which are mounted various types of connectors. In some examples, top 102 may include 72 storage-drive connectors 104, two compute-module connectors 106, two storage-controller connectors 108, two I/O-module connectors 110, four fan module connectors 112, a front-panel connector 114, and a power connector 116. While not shown in FIG. 1, drive-plane board 100 may include electrical conductors that electrically connect some or all of the connectors shown in FIG. 1.

Figure 4:
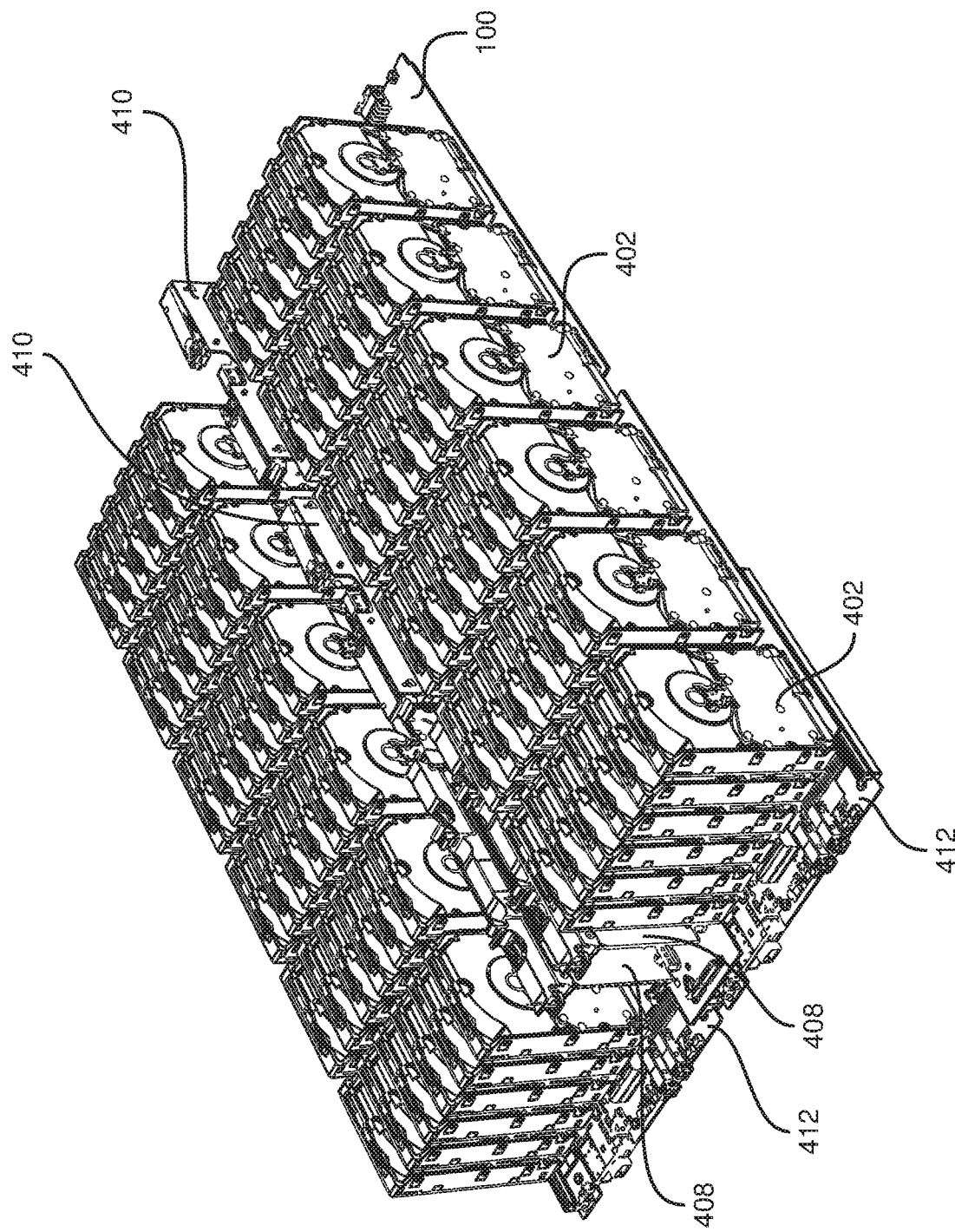
FIG. 4 is a perspective view of exemplary storage-system drives and storage-system modules.

Each of storage-drive connectors 104 may be configured to interface with a single storage drive, such as one of storage drives 402 illustrated in FIG. 4. The term "storage drive," as used herein, generally refers to any device capable of storing electronic data. In some examples, storage-drive connectors 104 may be configured to interface with solid state drives, hard disk drives, and/or optical drives. In some examples, storage-drive connectors 104 may be configured to interface with two or more different types of storage drives. For example, storage-drive connectors 104 may be configured to interface with storage drives that have different physical form factors, that are made up of different types of storage (e.g., solid state or hard disk), that use different protocols, and/or that use different types of connectors. In some examples, storage-drive connectors 104 may be configured to interface with serial attached small computer system interface (SAS) drives, serial advanced technology attachment (SATA) drives, and/or Non-Volatile Memory Express (NVMe) drives. In some examples, storage-drive connectors 104 may be configured to enable hot-swapping of storage drives.

Each of compute-module connectors 106 may be configured to interface with a compute module, such as one of compute modules 408 in FIG. 4. The term "compute module," as used herein, generally refers to any server module whose primary function is computational and/or any server module whose primary function is to provide data storage services. In some examples, compute-module connectors 106 may be configured to interface with two or more different types of compute modules. Each of storage-controller connectors 108 may be configured to interface with a storage-controller module, such as one of storage-controller modules 410 in FIG. 4. The term "storage-controller module," as used herein, generally refers to any storage-system module whose primary function is to control and communicate with storage drives. Each of I/O-module connectors 110 may be configured to interface with an I/O module, such as one of I/O modules 412 in FIG. 4. The term "I/O module," as used herein, generally refers to any storage-system module whose primary function is to facilitate data transfer in and out of a storage system.

Figure 2:
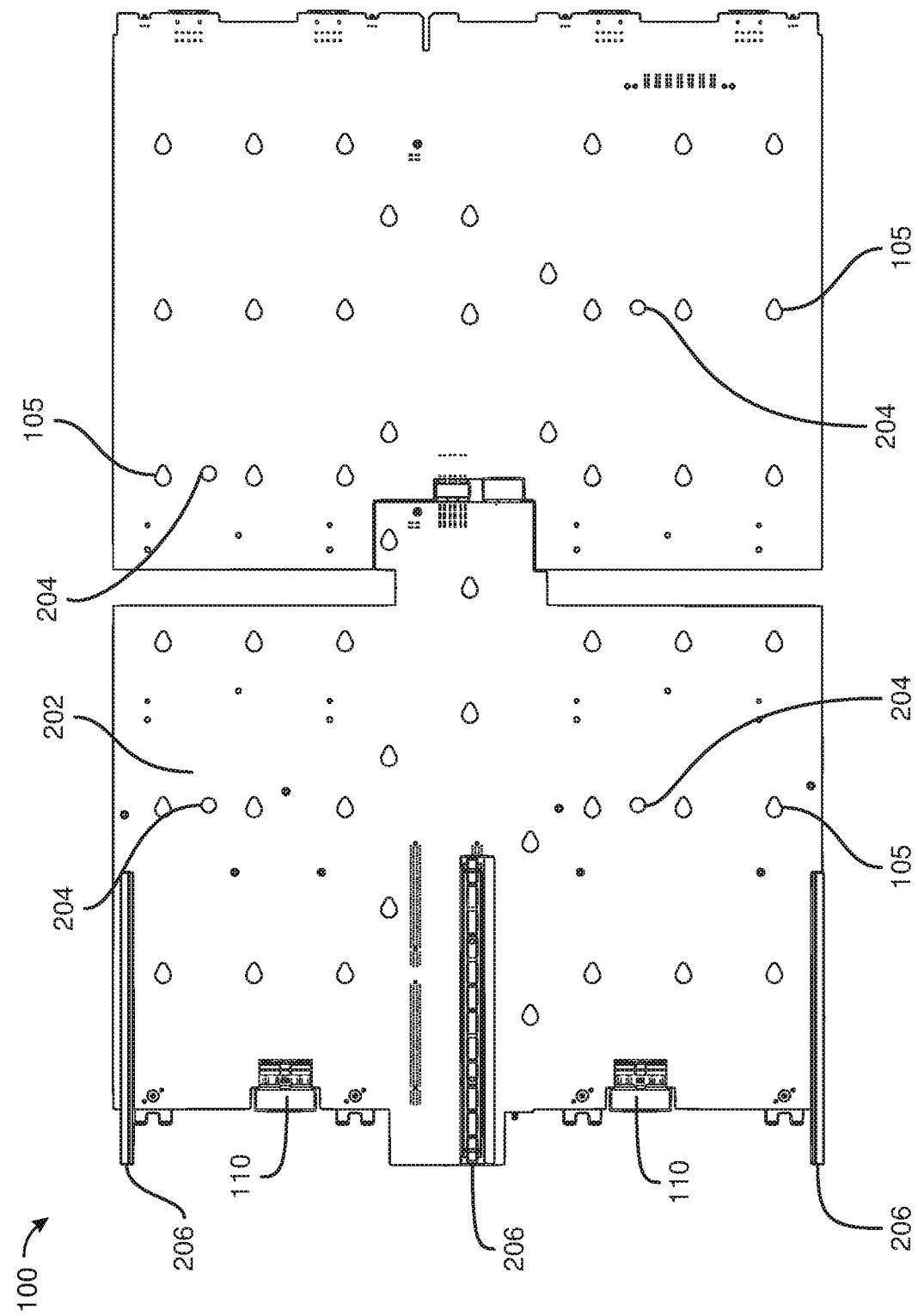
FIG. 2 is a bottom view of the exemplary drive-plane board illustrated in FIG. 1.
Figure 3:
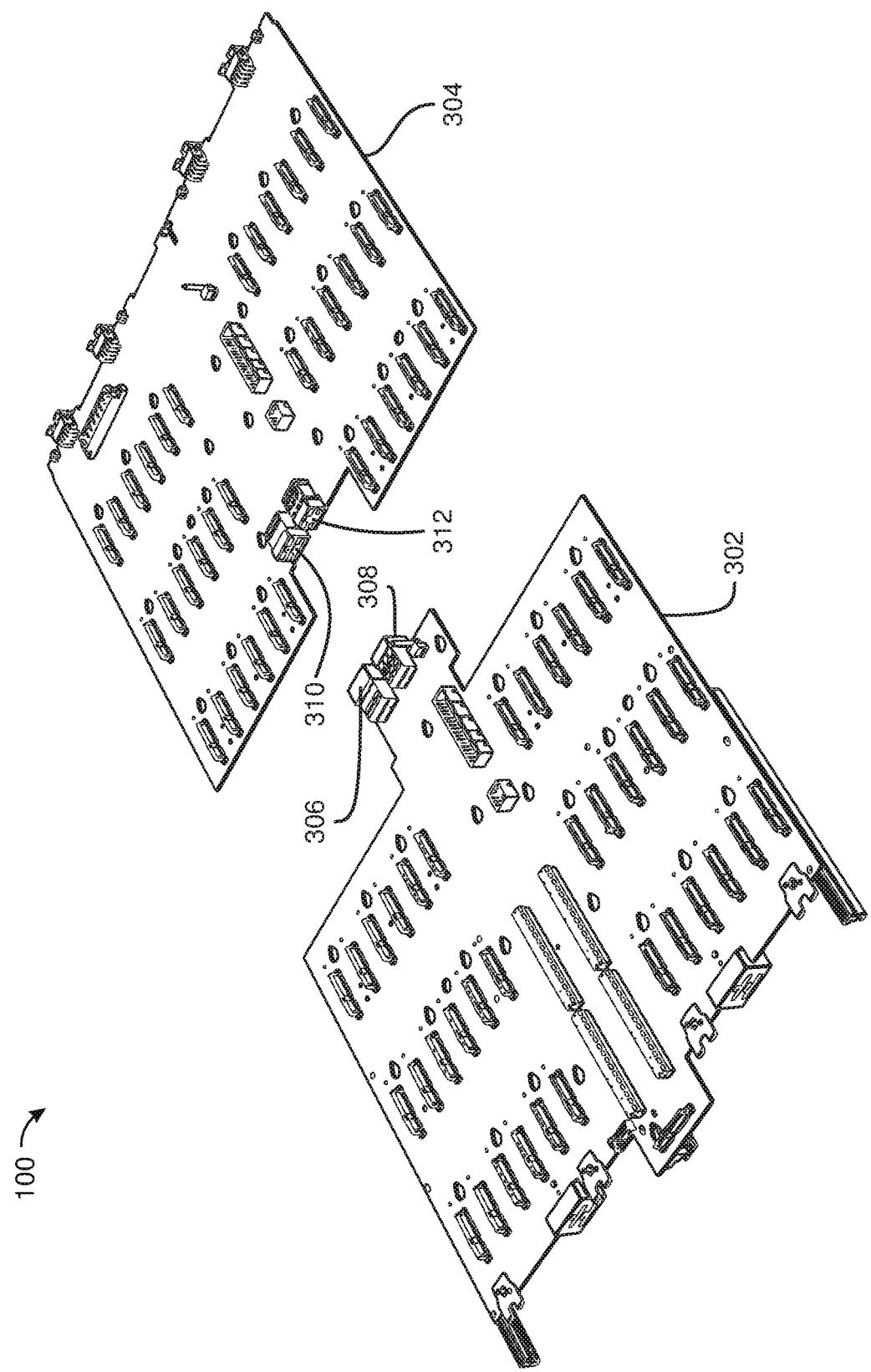
FIG. 3 is a perspective view of the exemplary drive-plane board illustrated in FIG. 1 in a disconnected state.

As shown in FIG. 1, drive-plane board 100 may include keyhole openings 105 that are configured to interlock with keyhole fasteners of a storage-system chassis within which drive-plane board 100 may be removably installed. Drive-plane board 100 may have few additional elements other than those illustrated in FIG. 1. In some examples, as shown in FIG. 2, a bottom 202 of drive-plane board 100 may include holes 204 that are sized to receive screws (e.g., screws 702 shown in FIG. 7) that couple drive-plane board 100 to a storage system drawer and rails 206 that are configured to secure an I/O-module drawer containing an I/O module. As illustrated in FIG. 3, drive-board 100 may be made up of one or more separable pieces. In the example shown, drive-board 100 may include a front PCB 302 and a rear PCB 304 that may be electrically coupled via high-speed connectors 306-312. In some examples, high-speed connectors 306-312 may provide power and communication pathways between the components of front PCB 302 and the components of rear PCB 304.

Figure 5:
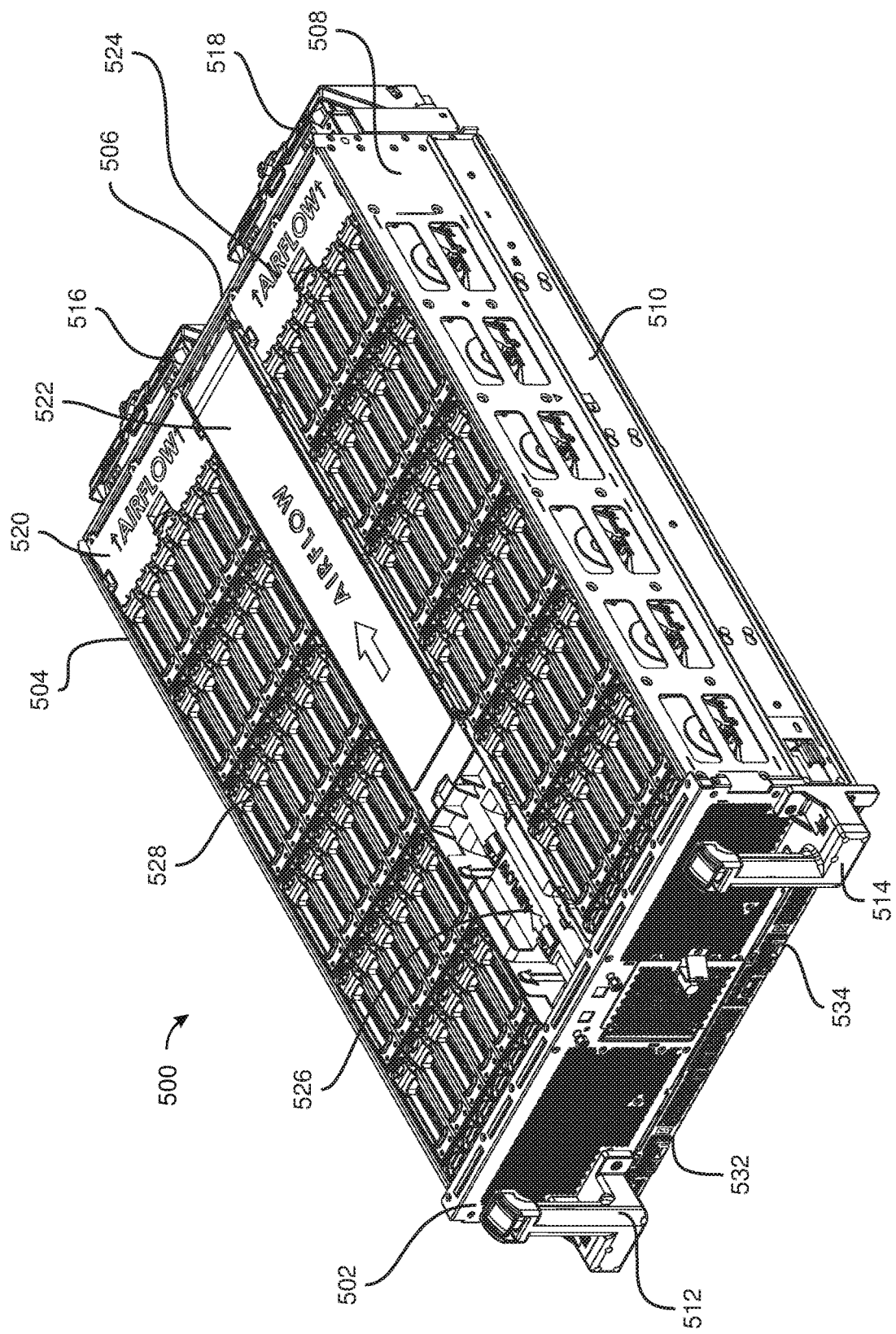
FIG. 5 is a perspective view of an exemplary storage-system drawer.
Figure 6:
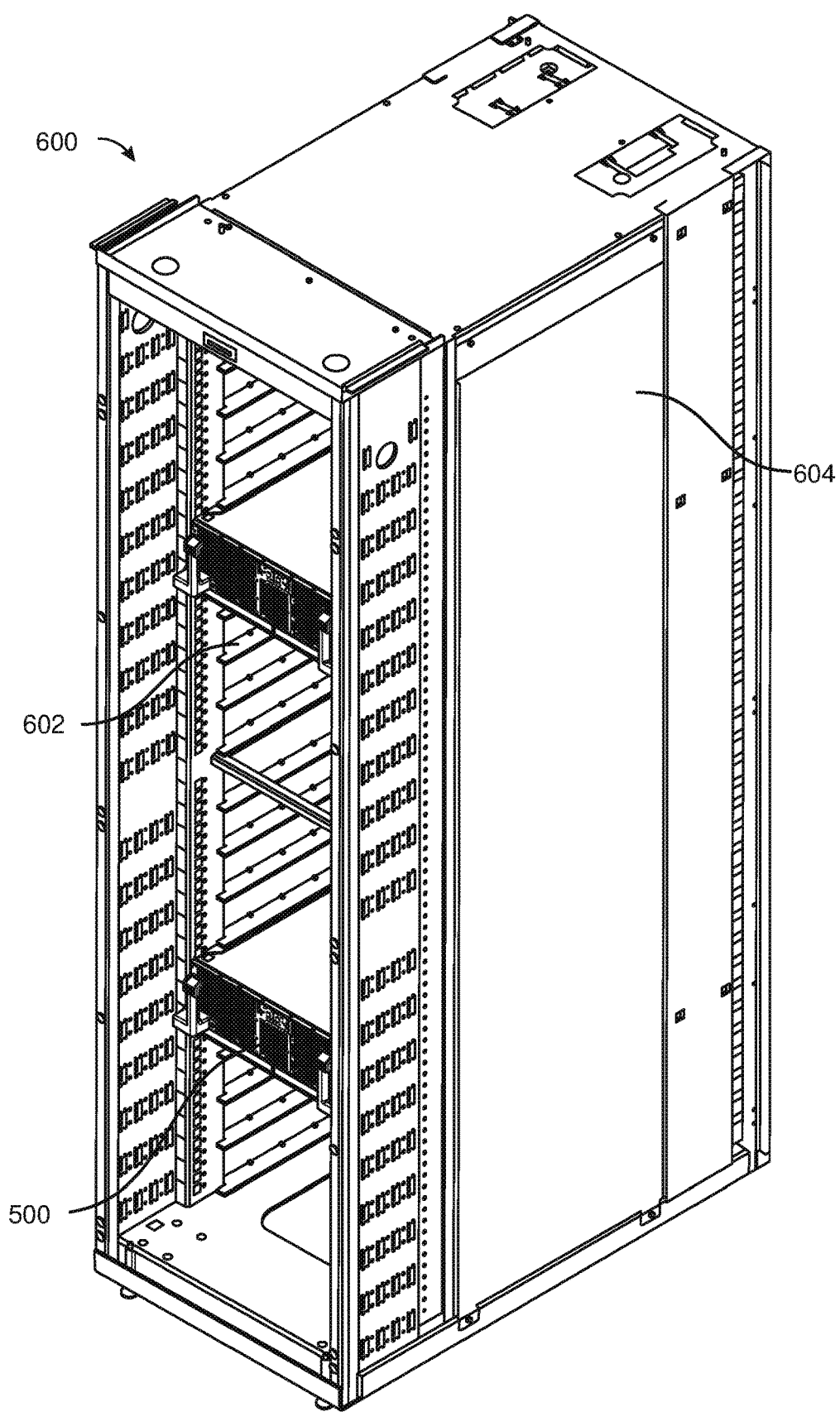
FIG. 6 is a perspective view of an exemplary data-center rack with several storage-system drawers.

FIG. 5 shows a perspective view of a storage-system drawer 500. The term "storage-system drawer," as used herein, generally refers to any structure that is adapted to house the various components that make up a storage system. As illustrated in FIG. 5, storage-system drawer 500 may include a chassis (e.g., a metallic enclosure) made up of a front 502, a left side 504, a rear 506, and a right side 508. The chassis of storage-system drawer 500 may be adapted to be housed in a data-center rack 600 as illustrated in FIG. 6. In one example, storage-system drawer 500 may be positioned on a support tray (such as support tray 602) coupled to a frame 604 of data-center rack 600. As used herein, the term "data-center rack" generally refers to any multi-system chassis structure for housing multiple storage-system drawers and chassis and/or providing support for one or more cables that connect to the storage-system drawers and chassis. In some examples, a data-center rack may also contain power supplies, network switches, and/or battery backup units.

Returning to FIG. 5, storage-system drawer 500 may include slide mechanisms (e.g., drawer-slide mechanism 510) that are coupled to left side 504 and right side 508 and enable storage-system drawer 500 to be fully extended out of data-center rack 600 for servicing. As shown, storage-system drawer 500 may include pull-handle 512 and pull-handle 514 configured to enable a technician to easily pull storage-system drawer 500 out from and return storage-system drawer 500 to data-center rack 600.

In some examples, the chassis of storage-system drawer 500 may be sized to house all of the storage-system components illustrated in FIG. 4. As shown in FIG. 5, storage-system drawer 500 may be configured so that most of the storage-system components that are contained within storage-system drawer 500 may be serviced through the top side of storage-system drawer 500. For example, each storage drive contained in storage-system drawer 500 may be secured within storage-system drawer 500 via a latch (e.g., a latch 528) adapted to hold the storage drive in place when closed and enable removal of the storage drive when open. In some embodiments, storage-system drawer 500 may include one or more removable covers (e.g., removable covers 520, 522, 524, and 526) that cover and provide access to other components contained within storage-system drawer 500, such as a compute module, a storage-controller card, and/or cables.

Additionally or alternatively, storage-system drawer 500 may be configured so that some of the storage-system components that are contained within storage-system drawer 500 may be serviced through the front, the bottom, or the rear of storage-system drawer 500. For example, storage-system drawer 500 may include front-accessible I/O-module drawers, such as I/O-module drawers 532 and 534, that are adapted to secure I/O modules within storage-system drawer 500. As shown in FIG. 5, storage-system drawer 500 may also include a fan module 516 and a fan module 518 removably attached to rear 506. In some examples, fan module 516 and fan module 518 may include one or more fans that pull an airflow rearward through the chassis of storage-system drawer 500 for the purpose of cooling the storage-system components housed within storage-system drawer 500.

Figure 7:
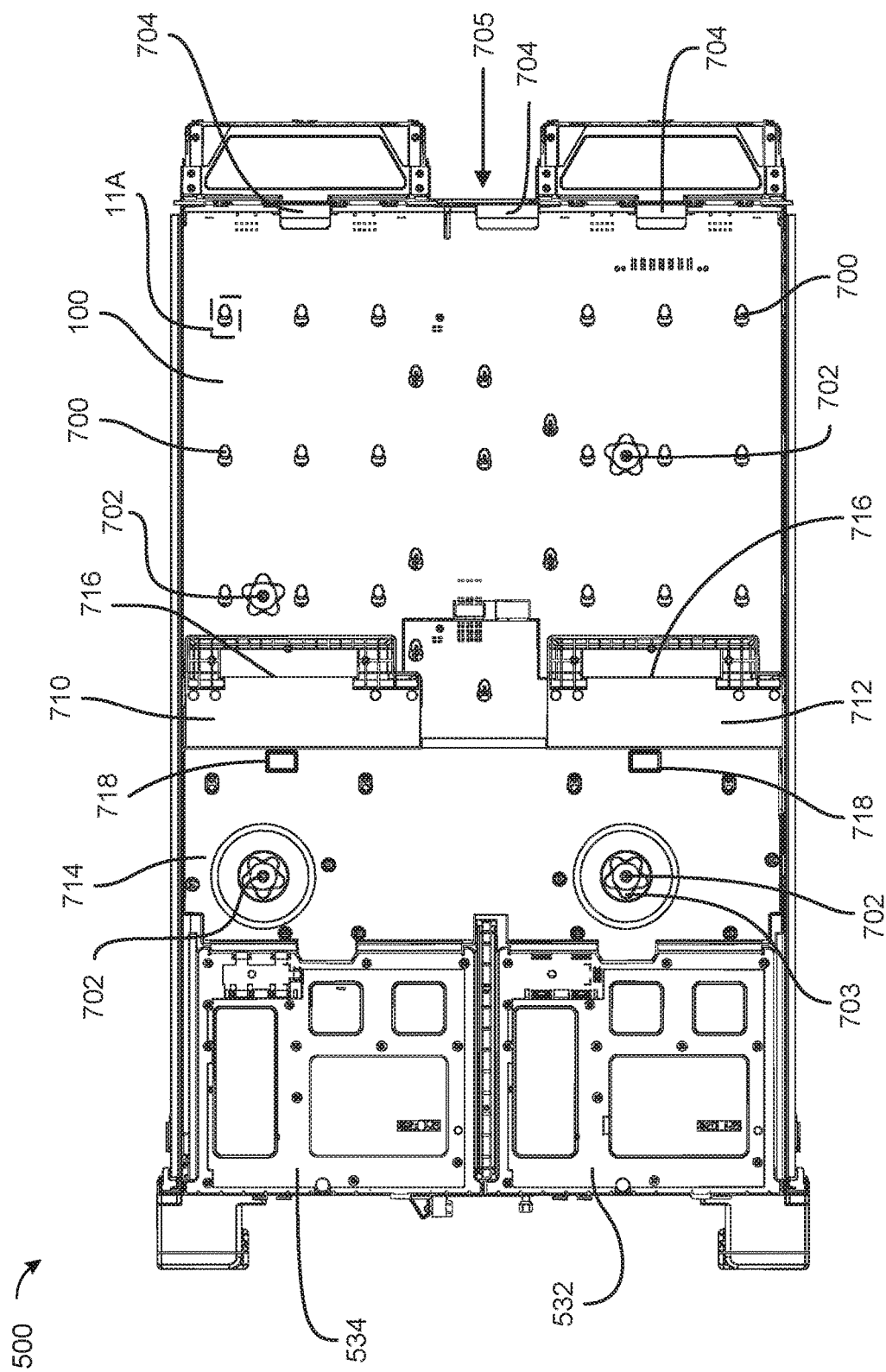
FIG. 7 is a bottom view of the exemplary storage-system drawer illustrated in FIG. 5.
Figure 11A:
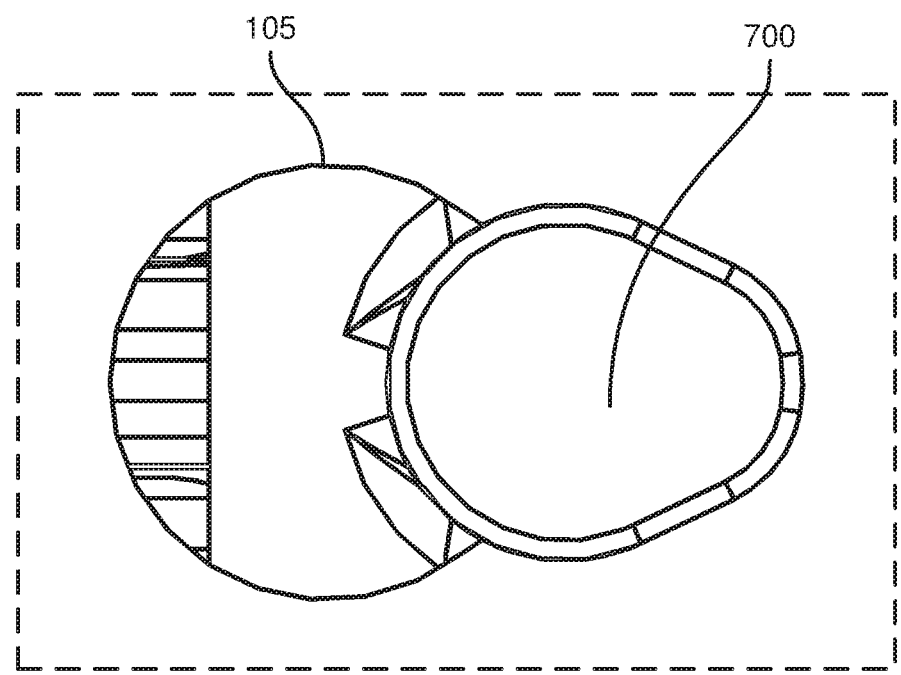
FIG. 11A is a close-up view of an exemplary keyhole interlocked with an exemplary keyhole fastener.
Figure 12:
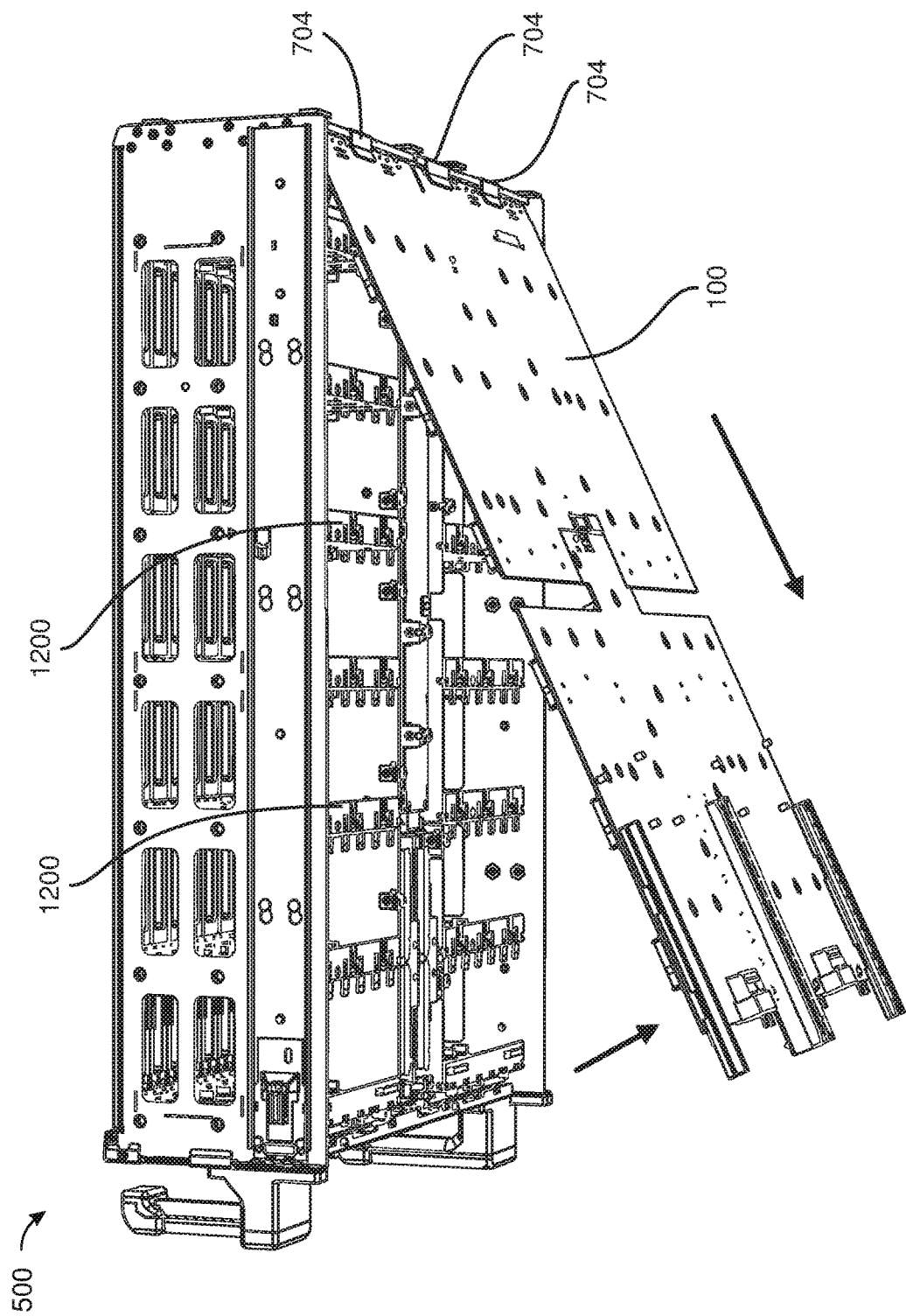
FIG. 12 is a perspective view of the exemplary storage-system drawer illustrated in FIG. 5 after the drive-plane board illustrated in FIG. 1 has been removed.
Figure 13:
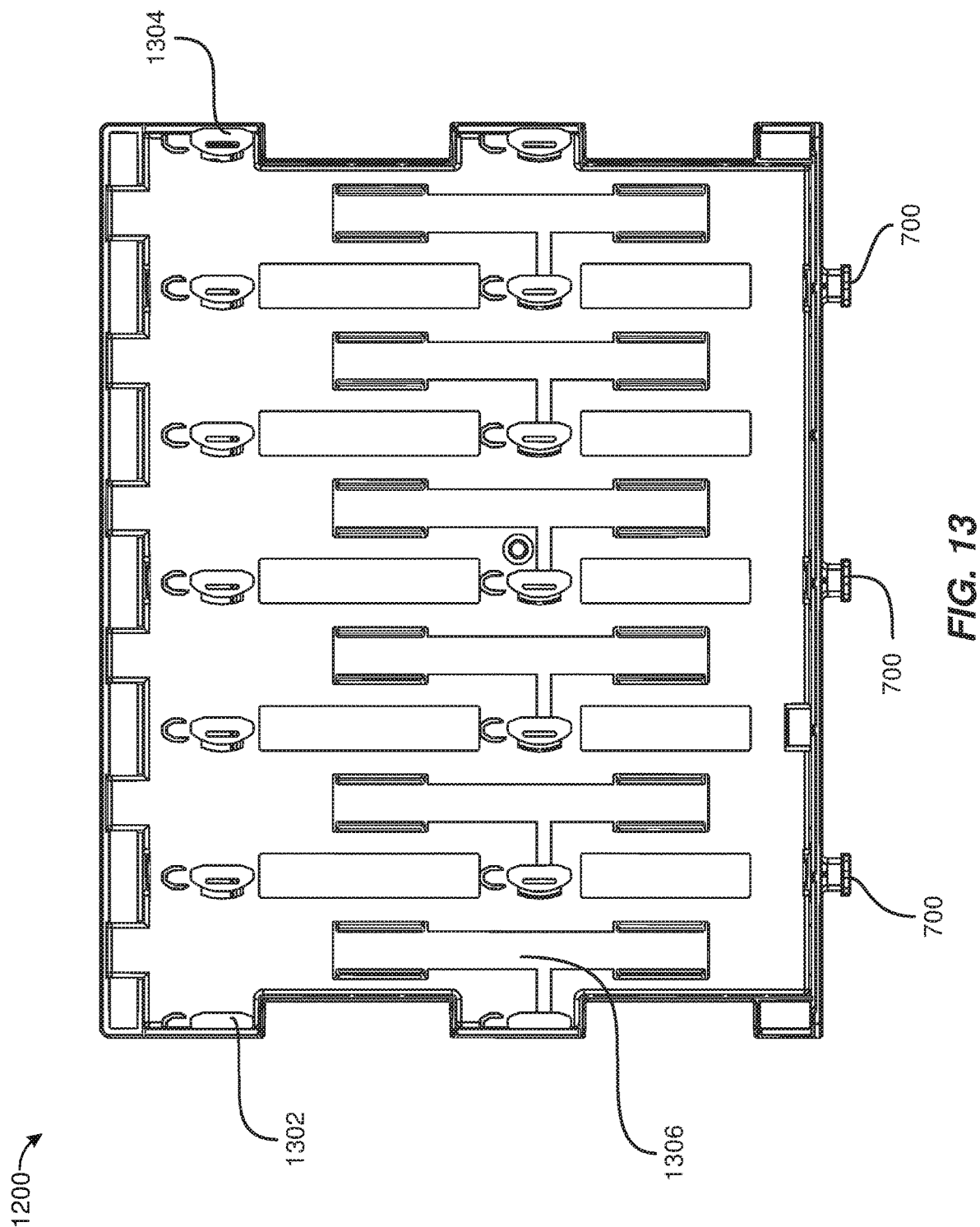
FIG. 13 is a front view of an exemplary multi-purpose storage-system partition.

In some examples, drive-plane board 100 may be accessed and/or removed from the bottom of storage-system drawer 500. FIG. 7 shows a bottom view of an open bottom 705 of storage-system drawer 500 with drive-plane board 100 installed. As shown, keyhole fasteners 700 and screws 702 may retain drive-plane board 100 within storage-system drawer 500. In some examples, keyhole fasteners 700 may be part of several multi-purpose storage-system partitions 1200 that are coupled to the chassis of storage-system drawer 500 as illustrated in FIGS. 12 and 13. In some examples, multi-purpose storage-system partitions 1200 may provide structural support for the chassis of storage-system drawer 500 by tying together portions of the chassis of storage-system drawer 500. Additionally, multi-purpose storage-system partitions 1200 may include various storage-drive contact points, such as contact points 1302, 1304, and 1306 illustrated in FIG. 13 that are configured to retain and support storage drives within storage-system drawer 500. In the position illustrated in FIG. 5, keyholes openings 105 are shown as interlocked with keyhole fasteners 700, a close-up of this interlocked position is shown in FIG. 11A, and screws 702 may be hand-knob screws (e.g., screws having hand knobs such as a hand knob 703 shown in FIG. 7) that are toollessly removeable. In some examples, keyhole openings 105 may be oriented to enable rearward disengagement of keyhole openings 105 from keyhole fasteners 700 and forward engagement of keyhole openings 105 with keyhole fasteners 700.

As shown in FIG. 7, rear 506 may include board-retaining brackets 704 that are configured to retain rear edge 103 of drive-plane board 100 within storage-system drawer 500 when keyhole openings 105 are disengaged from keyhole fasteners 700. In some examples, board-retaining brackets 704 may protect a technician from sliding drive-plane board 100 too far back during removal. Board-retaining brackets 704 may also be configured to position rear edge 103 of drive-plane board 100 such that keyhole openings 105 are positioned to receive keyhole fasteners 700.

In some examples, storage-system drawer 500 may include a baffle 710, a baffle 712, and a baffle 714 that are sized and configured to retain the airflows generated by fan modules 516 and 518 within storage-system drawer 500. Baffle 710 and baffle 712 may also be coupled to drive-plane board 100 to provide structural rigidity to drive-plane board 100. In at least one example, baffle 710 and baffle 712 may be made from a rigid material, such as a rigid plastic. In some examples, baffle 710, baffle 712, and baffle 714 may include fingerholds, such as fingerholds 716 and 718, that enable a technician to grasp and/or remove drive-plane board 100 from storage-system drawer 500.

Figure 8:
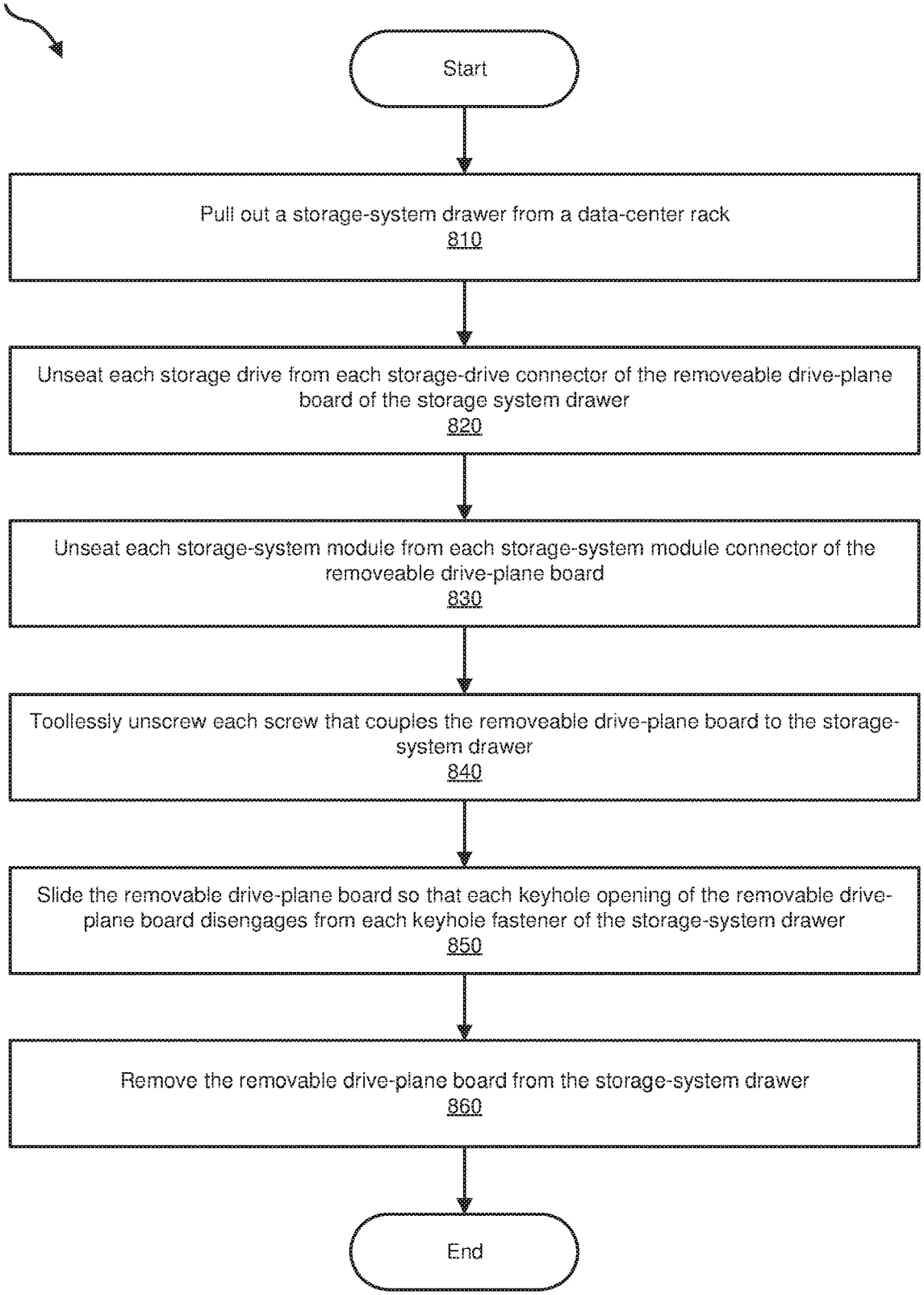
FIG. 8 is a flow diagram of an exemplary method for removing a drive-plane board from a storage-system drawer.
Figure 9:
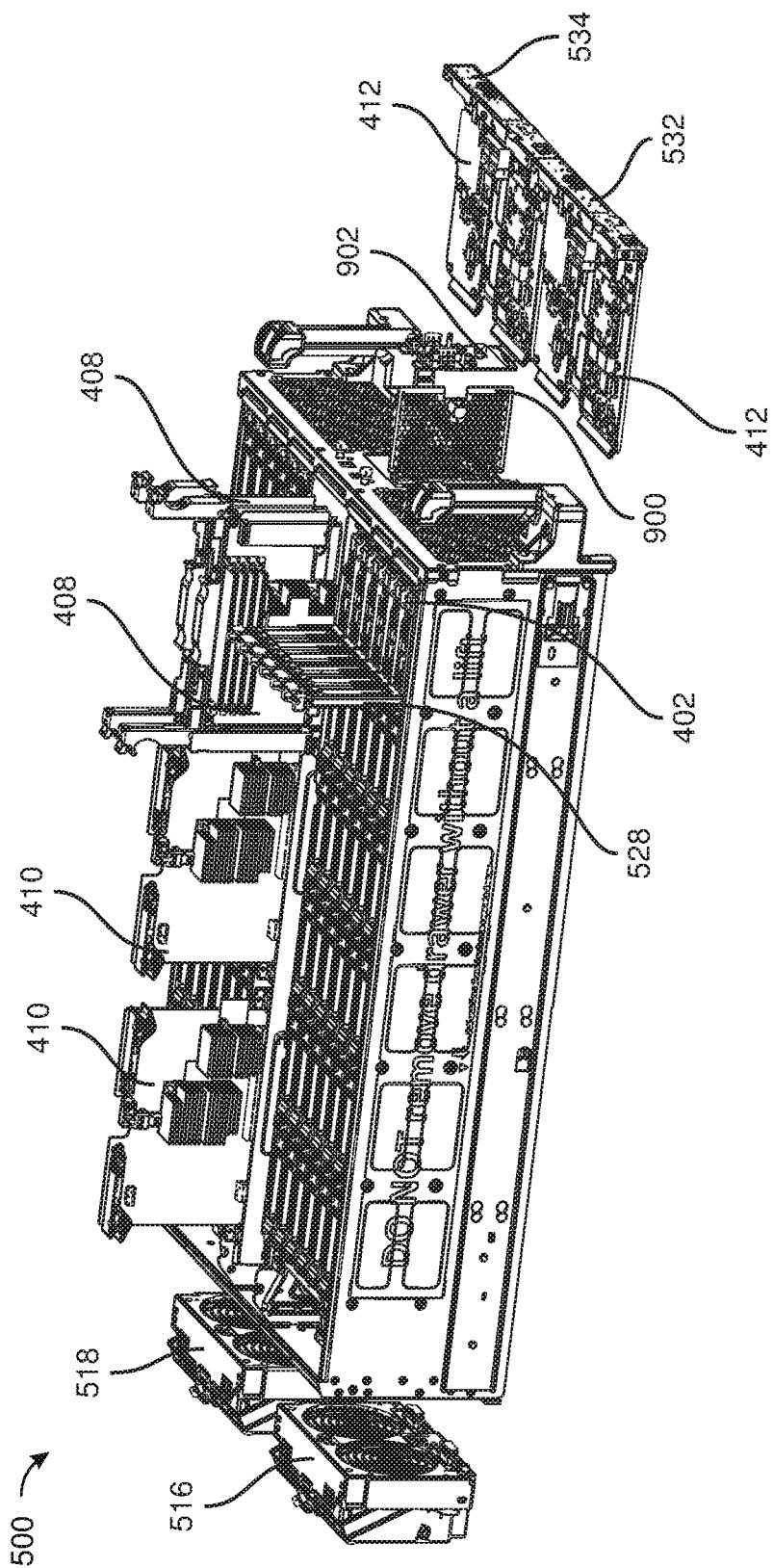
FIG. 9 is a perspective view of the exemplary storage-system drawer illustrated in FIG. 5 with various components removed.
Figure 10:
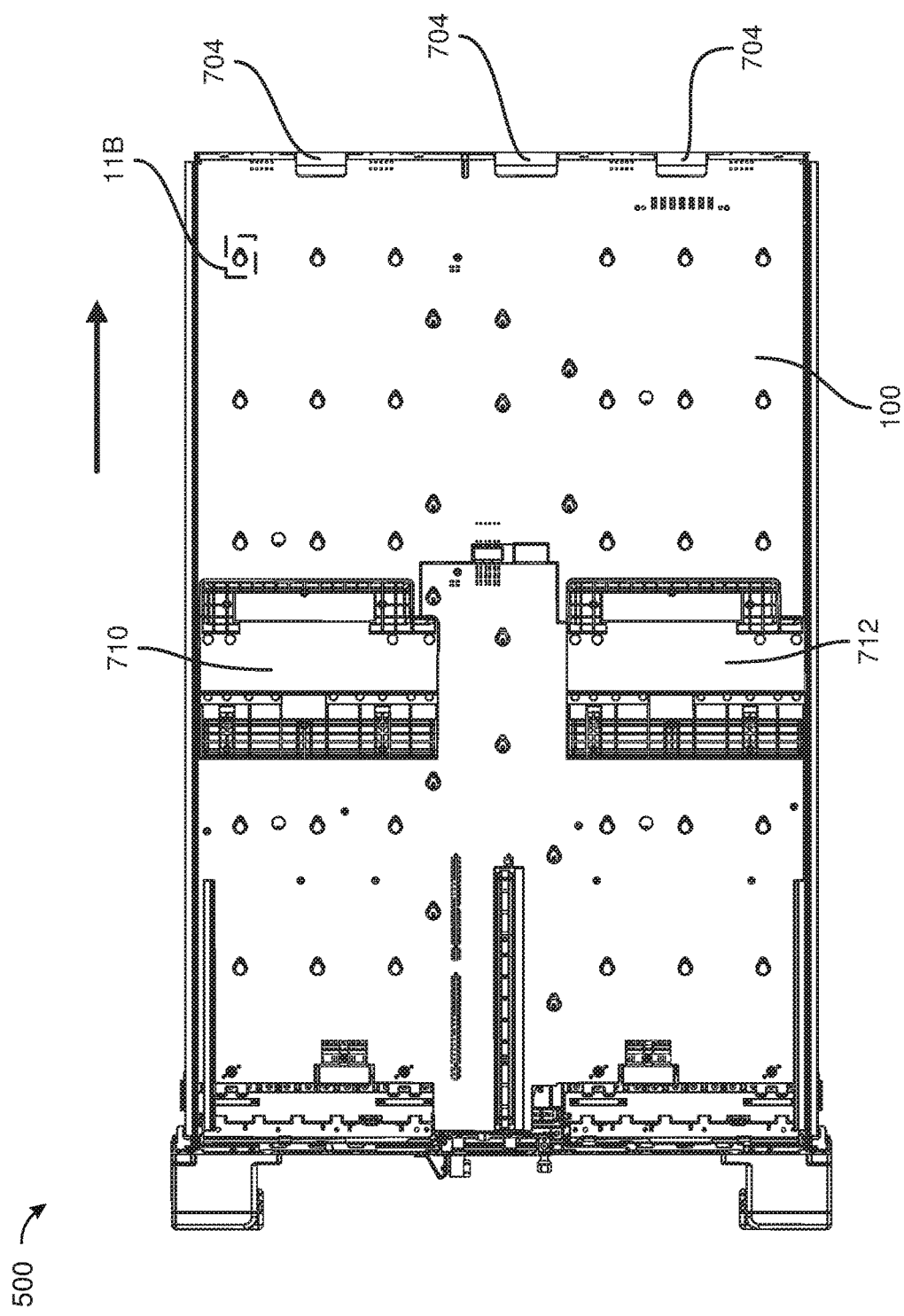
FIG. 10 is an additional bottom view of the exemplary storage-system drawer illustrated in FIG. 5.
Figure 14:
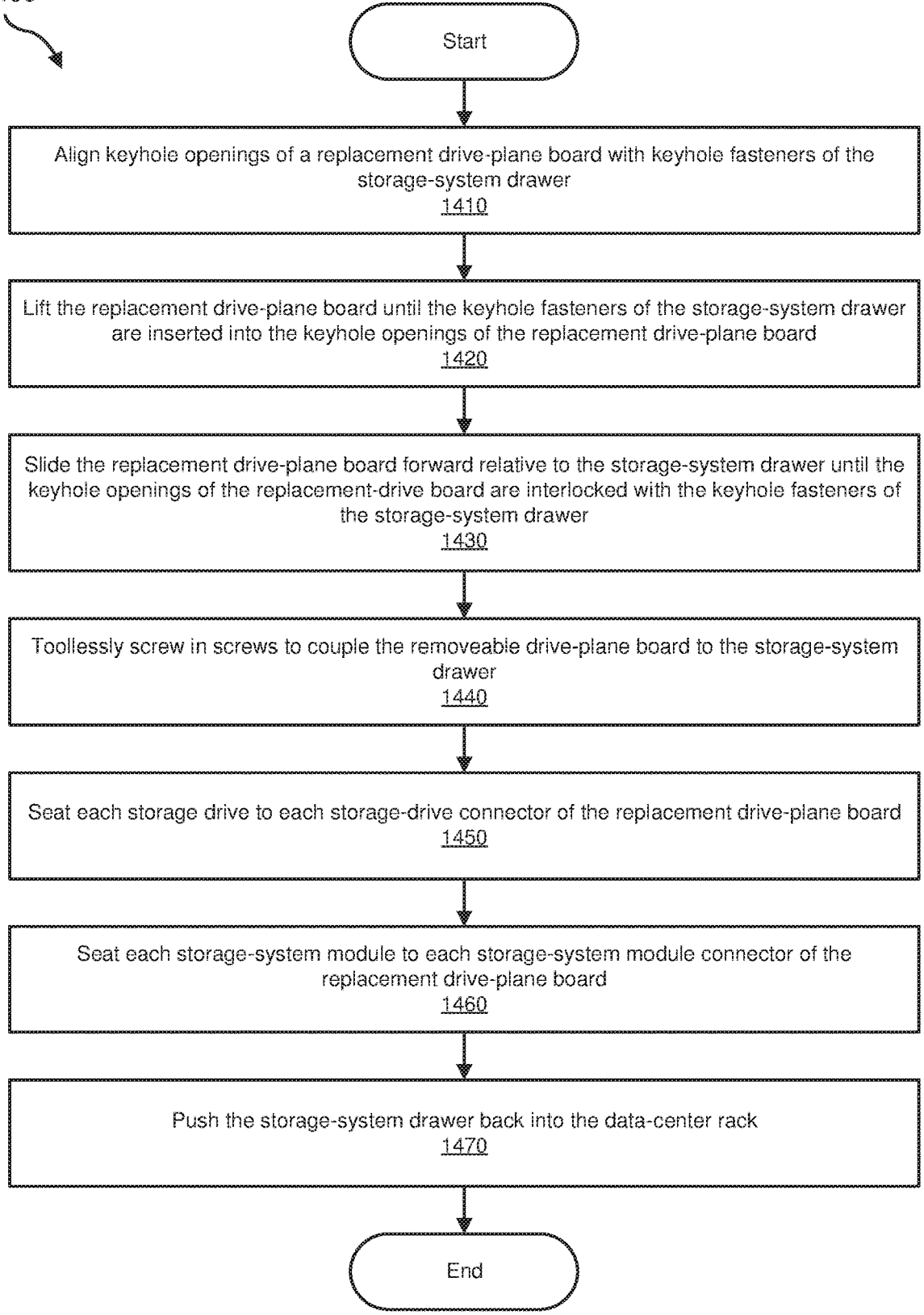
FIG. 14 is a flow diagram of an exemplary method for installing a drive-plane board within a storage-system drawer.

FIGS. 8-12 and 14 show, by way of example, methods for replacing a storage-system drawer's drive-plane board. In particular, FIG. 8 illustrates a flow diagram of a method 800 for removing a drive-plane board from the storage-system drawer, and FIG. 14 illustrates a flow diagram of a method 1400 for installing a replacement drive-plane board into the storage-system drawer. As shown in FIG. 8, at step 810 the storage-system drawer may be pulled out from the data-center rack. Using FIG. 6 as an example, storage-system drawer 500 may be fully pulled out of data-center rack 600. In some examples, fan units 516 and 518 may be removed from rear 506 of storage-system drawer 500 before storage-system drawer 500 is removed from data-center rack 600, as shown in FIG. 9.

At step 820, each storage drive from each storage-drive connector of the removeable drive-plane board may be unseated. Using FIG. 9 as an example, each of latches 528 may be opened, and each of storage drives 402 may be unseated from storage-drive connectors 104 of drive-plane board 100. In some examples, each of storage drives 402 may also be removed from storage-system drawer 500. In some examples, the opening of latch 528 may lift a drive-unseating mechanism positioned under storage drive 402, and the drive-unseating mechanism may lift storage drive 402 sufficiently high enough (e.g., two inches) to unseat storage drive 402 from its corresponding storage-drive connector 104.

At step 830, each storage-system module from each storage-system module connector of the removeable drive-plane board may be unseated. Using FIG. 9 as an example, storage-controller modules 410 may be lifted and removed from storage-controller module connectors 108, compute modules 408 may be lifted and removed from compute-module connectors 106, and I/O modules 412 may be removed from storage-system drawer 500 by pulling out I/O-module drawers 532 and 534 from front 502 of storage-system drawer 500. In some examples, removable covers 522 and 526 may be removed from storage-system drawer 500 to provide access to storage-controller modules 410 and compute modules 408.

At step 840, each screw that couples the removeable drive-plane board to the storage-system drawer may be toollessly unscrewed. For example, each of screws 702 shown in FIG. 7 may be toollessly unscrewed from the underside of storage-system drawer 500. In some examples, removable cover 520 may also be removed from storage-system drawer 500 to expose power connector 116, and a power cable may be disconnected from power connector 116. Additionally or alternatively, a front-panel door 900 of storage-system drawer 500 may be opened to expose a front-panel board 902 connected to front-panel connector 114, and front-panel board 902 may be removed from front-panel connector 114. In some examples, front 502 of storage-system drawer 500 may include various output components (e.g., indicator lights) that are connected to drive-plane board 100. In such examples, each output component may be disconnected from drive-plane board 100.

Figure 11B:
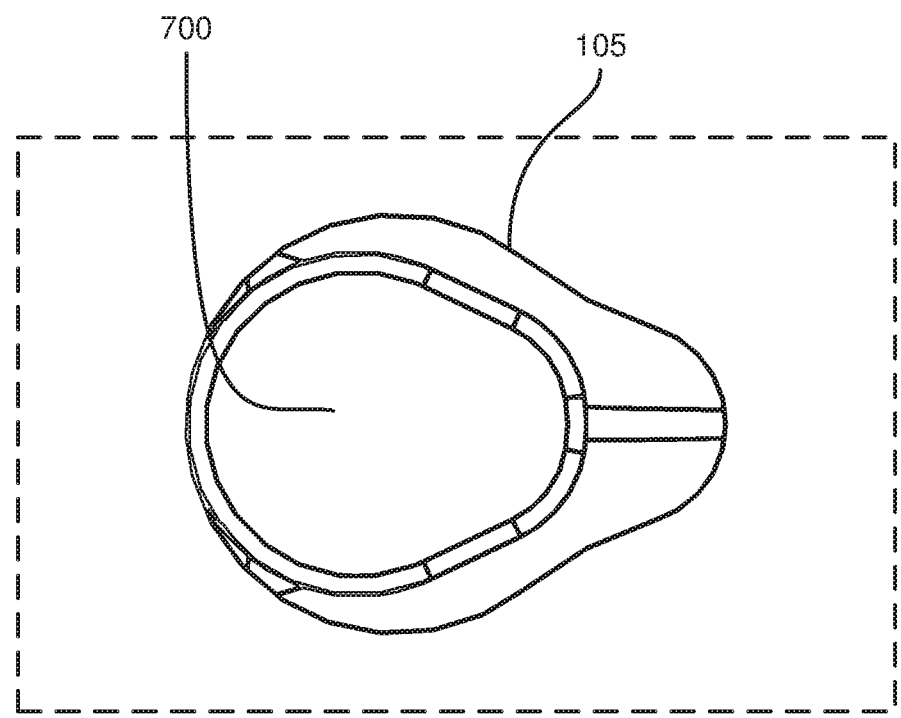
FIG. 11B is a close-up view of an exemplary keyhole disengaged from an exemplary keyhole fastener.

At step 850, the removable drive-plane board may be slid so that each keyhole opening of the removable drive-plane board disengages from each keyhole fastener of the storage-system drawer. Using FIG. 10 as an example, drive-plane board 100 may be slid rearward within storage-system drawer 500 so that keyholes openings 105 disengage with keyhole fasteners 700, as shown in FIG. 11B. In some examples, board-retaining brackets 704 may act as stops for rear edge 103 of drive-plane board 100. In this example, board-retaining brackets 704 may stop drive-plane board 100 from being slid back too far within storage-system drawer 500 and/or may position keyholes openings 105 of drive-plane board 100 so that they are disengaged from keyhole fasteners 700. In some examples, a technician may use finger holds 716 and 718 to grasp drive-plane board 100 and/or apply a rearward force to drive-plane board 100.

At step 860, the removable drive-plane board may be removed from the storage-system drawer. For example, front edge 101 of drive-plane board 100 may be lowered from storage-system drawer 500 to the position illustrated in FIG. 12, and drive-plane board 100 may be pulled away from storage-system drawer 500 and board-retaining brackets 704 to remove it from storage-system drawer 500. In this example, board-retaining brackets 704 may support rear edge 103 of drive-plane board 100 as front edge 101 of drive-plane board 100 is lowered.

Figure 15:
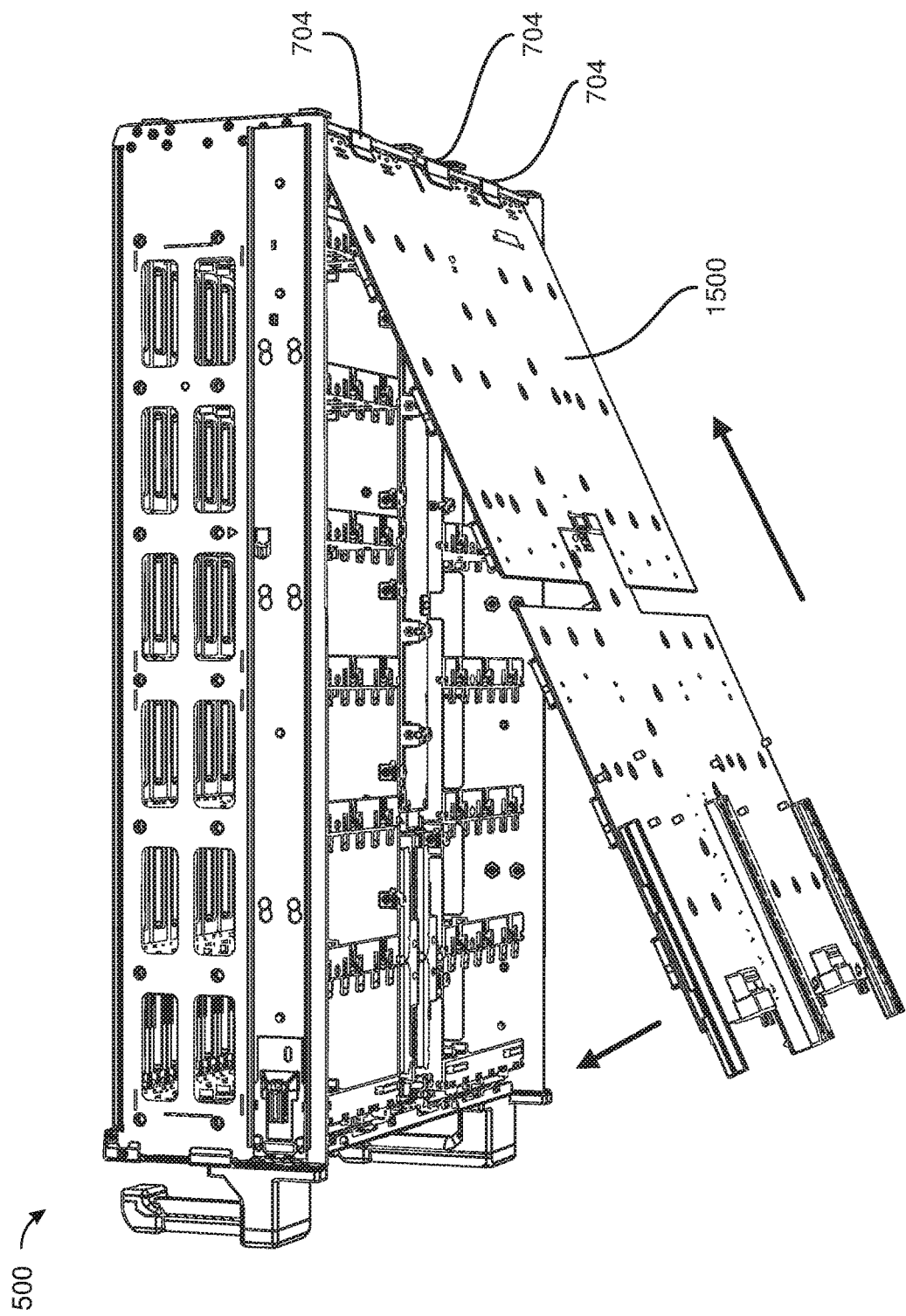
FIG. 15 is a perspective view of the exemplary storage-system drawer illustrated in FIG. 5 as a replacement drive-plane board is being installed.
Figure 16:
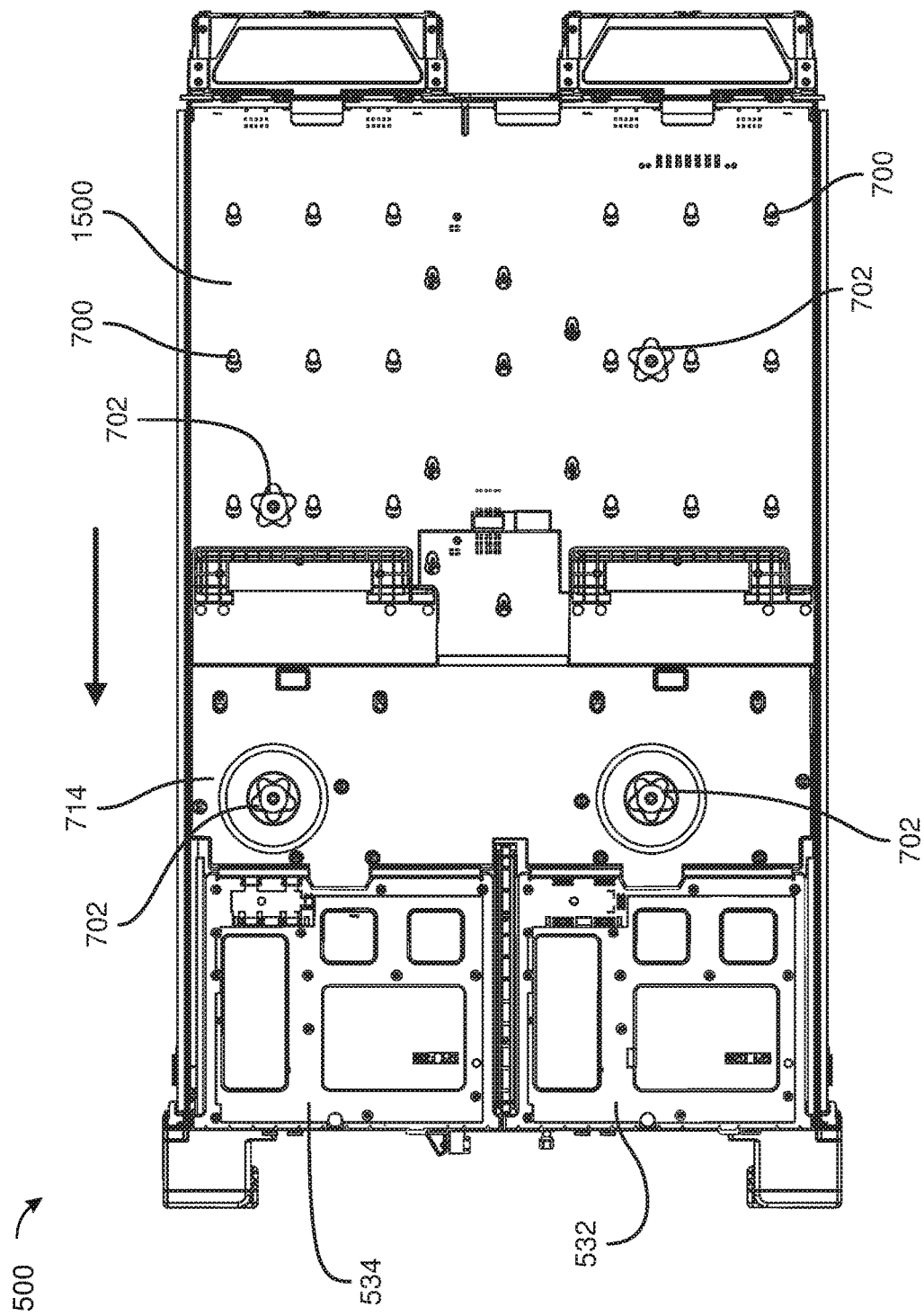
FIG. 16 is a bottom view of the exemplary storage-system drawer illustrated in FIG. 5 after the replacement drive-plane board illustrated in FIG. 15 has been installed.

Once drive-plane board 100 is removed from storage-system drawer 500, a replacement drive-plane board may be installed into storage-system drawer 500 by essentially reversing the steps illustrated in connection with method 800 and described above. As shown in FIG. 14, at step 1410, keyhole openings of the replacement drive-plane board may be aligned with the keyhole fasteners of the storage-system drawer. In one example, as shown in FIG. 15, a rear edge of replacement drive-plane board 1500 may be placed on board-retaining brackets 704 to align keyholes of replacement drive plane board 1500 with keyhole fasteners 700 of storage-system drawer 500.

At step 1420, the replacement drive-plane board may be lifted until the keyhole fasteners of the storage-system drawer are inserted into the keyhole openings of the replacement drive-plane board. As shown in FIG. 15, a front of replacement drive-plane board 1500 may be lifted so that keyholes of replacement drive plane board 1500 accept keyhole fasteners 700 of storage-system drawer 500.

At step 1430, the replacement drive-plane board may be slid forward relative to the storage-system drawer until the keyhole openings of the replacement-drive board are interlocked with the keyhole fasteners of the storage-system drawer. Using FIG. 16 as an example, replacement drive-plane board 1500 may be slid forward within storage-system drawer 500 until each of its keyholes are interlocked with keyhole fasteners 700 of storage-system drawer 500.

At step 1440, each of the screws removed at step 840 in FIG. 8 may be toollessly screwed back in to couple the removeable drive-plane board to the storage-system drawer. Using FIG. 16 as an example, each of screws 702 may be toollessly screwed back into the underside of storage-system drawer 500.

At step 1450, each storage drive removed at step 820 in FIG. 8 may be reseated to each storage-drive connector of the replacement drive-plane board. Using FIG. 9 as an example, each of storage drives 402 may be reseated to storage-drive connectors of replacement drive-plane board 1500, and/or each of latches 528 may be closed.

At step 1460, each storage-system module removed at step 830 in FIG. 8 may be reseated to each storage-system module connector of the replacement drive-plane board. Using FIG. 9 as an example, storage-controller modules 410 may be reinserted into storage-controller connectors of replacement drive-plane board 1500, compute modules 408 may be reinserted into compute-module connectors of replacement drive-plane board 1500, and I/O modules 412 may be reinserted into I/O-module connectors of replacement drive-plane board 1500 by reinserting I/O-module drawers 532 and 534 into front 502 of storage-system drawer 500.

At step 1470, the storage-system drawer may be pushed back into the data-center rack. Using FIG. 6 as an example, storage-system drawer 500 may be pushed back into data-center rack 600. In some examples, before storage system drawer 500 is pushed back into data center rack 600, a front-panel board may be reinserted back into front-panel connector 114, a power cable may be reinserted back into power connector 116, and removable covers 520-526 may be replaced.

As explained above, embodiments of the instant disclosure may enable a removable drive-plane board to be easily removed from a storage-system drawer. In some examples, embodiments of the instant disclosure may enable toolless replacement of the removable drive-plane board. In some examples, the removable drive-plane board may include keyhole openings that are configured to easily interlock and disengage with keyhole fasteners of the storage-system drawer, and thumbscrews with hand knobs may be used to hold the removable drive-plane board in place within the storage-system drawer. Additionally or alternatively, the storage-system drawer may include various toolless latches for unseating storage drives and modules from the removable drive-plane board. In some examples, a bracket at the back of the storage-system drawer may protect a technician from sliding the removable drive-plane board too far back during removal.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A removeable drive-plane board comprising:
   a plurality of storage-drive connectors;
   a storage-system module connector electrically coupled to the plurality of storage-drive connectors; and
   a plurality of keyhole openings that are configured to interlock with a plurality of keyhole fasteners of a storage-drive retaining member of a storage-system chassis, wherein:
      the storage-system chassis comprises an open bottom;
      the plurality of keyhole fasteners of the storage-drive retaining member are oriented downward relative to the open bottom of the storage-system chassis;
      the storage-drive retaining member is configured to retain a plurality of storage drives within the storage-system chassis after the plurality of storage drives are unseated from the plurality of storage-drive connectors; and
      the plurality of keyhole openings are oriented to enable the removeable drive-plane board to be removed from the open bottom of the storage-system chassis while the plurality of storage drives are retained within the storage-system chassis.

2. The removeable drive-plane board of claim 1, wherein the removeable drive-plane board further comprises an opening configured to accept a fastener, the fastener being configured to secure the removable drive-plane board to the storage-drive retaining member when the plurality of keyhole openings of the removable drive-plane board are interlocked with the plurality of keyhole fasteners of the storage-drive retaining member.

3. The removeable drive-plane board of claim 2, wherein the fastener comprises a screw having a hand knob.

4. The removeable drive-plane board of claim 1, wherein the plurality of keyhole openings of the removable drive-plane board are oriented to enable:
   rearward disengagement of the plurality of keyhole openings of the removable drive-plane board from the plurality of keyhole fasteners of the storage-drive retaining member; and
   forward engagement of the plurality of keyhole openings of the removable drive-plane board with the plurality of keyhole fasteners of the storage-drive retaining member.

5. The removeable drive-plane board of claim 1, further comprising:
   a front drive section located on a top side of the removable drive-plane board, the front drive section comprising a front portion of the plurality of storage-drive connectors;
   a rear drive section located on the top side of the removable drive-plane board, the rear drive section comprising a rear portion of the plurality of storage-drive connectors;
   an opening located between the front drive section and the rear drive section that allows air to flow from below the removable drive-plane board to above the removable drive-plane board; and
   an air baffle configured to direct a portion of an airflow through the opening from below the removable drive-plane board to above the removable drive-plane board.

6. The removeable drive-plane board of claim 5, wherein the air baffle comprises two or more fingerholds that enable a technician to grasp and remove the removable drive-plane board from the storage-system chassis by sliding the removable drive-plane board backward such that the plurality of keyhole openings of the removable drive-plane board disengage from the plurality of keyhole fasteners of the storage-drive retaining member.

7. The removeable drive-plane board of claim 5, further comprising:
   a front printed circuit board that comprises the front drive section; and
   a rear printed circuit board coupled to the front printed circuit board, the rear printed circuit board comprising the rear drive section; wherein:
      the opening is a gap located between the front printed circuit board and the rear printed circuit board; and
      the air baffle is:
         composed of rigid plastic;
         coupled to the front printed circuit board and the rear printed circuit board; and
         configured to rigidly tie the front printed circuit board to the rear printed circuit board.

8. The removeable drive-plane board of claim 1, wherein:
   the plurality of storage drives comprises a plurality of carrierless storage drives; and
   the storage-drive retaining member comprises a multi-purpose storage-system partition configured to retain the plurality of carrierless storage drives within the storage-system chassis.

9. A storage-system drawer comprising:
   a chassis having a front, a left side, a right side, a rear, and an open bottom;
   a storage-drive retaining member comprising a plurality of keyhole fasteners that are oriented downward relative to the open bottom of the chassis, wherein the storage-drive retaining member is configured to retain a plurality of storage drives within the chassis after the plurality of storage drives are unseated from a plurality of storage-drive connectors; and a removeable drive-plane board comprising:
    a plurality of keyhole openings that are configured to interlock with the plurality of keyhole fasteners of the storage-drive retaining member, wherein the plurality of keyhole openings are oriented to enable the removeable drive-plane board to be removed from the open bottom of the chassis while the plurality of storage drives are retained within the chassis;
    the plurality of storage-drive connectors; and
    a storage-system module connector electrically coupled to the plurality of storage-drive connectors.

10. The storage-system drawer of claim 9, wherein the storage-system drawer further comprises a fastener configured to secure the removable drive-plane board to the storage-drive retaining member when the plurality of keyhole openings of the removable drive-plane board are interlocked with the plurality of keyhole fasteners of the storage-drive retaining member.

11. The storage-system drawer of claim 10, wherein the fastener comprises a screw having a hand knob.

12. The storage-system drawer of claim 9, wherein the plurality of keyhole openings of the removable drive-plane board are oriented to enable:
    rearward disengagement of the plurality of keyhole openings of the removable drive-plane board from the plurality of keyhole fasteners of the storage-drive retaining member; and
    forward engagement of the plurality of keyhole openings of the removable drive-plane board with the plurality of keyhole fasteners of the storage-drive retaining member.

13. The storage-system drawer of claim 9, wherein the rear of the chassis comprises an additional retaining member configured to retain a rear edge of the removable drive-plane board when the plurality of keyhole openings of the removable drive-plane board are disengaged from the plurality of keyhole fasteners of the storage-drive retaining member.

14. The storage-system drawer of claim 9, wherein the rear of the chassis comprises an additional retaining member configured to position a rear edge of the removable drive-plane board such that the plurality of keyhole openings of the removable drive-plane board can receive the plurality of keyhole fasteners of the storage-drive retaining member.

15. The storage-system drawer of claim 9, wherein:
    the plurality of storage drives comprises a plurality of carrierless storage drives; and
    the storage-drive retaining member comprises a multi-purpose storage-system partition configured to retain the plurality of carrierless storage drives within the chassis.

16. The storage-system drawer of claim 9, wherein the removable drive-plane board comprises:
    a front drive section located on a top side of the removable drive-plane board, the front drive section comprising a front portion of the plurality of storage-drive connectors; and
    a rear drive section located on the top side of the removable drive-plane board, the rear drive section comprising a rear portion of the plurality of storage-drive connectors;
    an opening located between the front drive section and the rear drive section that allows air to flow from below the removable drive-plane board to above the removable drive-plane board;
    an air baffle configured to direct a portion of an airflow through the opening from below the removable drive-plane board to above the removable drive-plane board.

17. The storage-system drawer of claim 16, wherein:
the removable drive-plane board comprises:
    a front printed circuit board that comprises the front drive section; and
    a rear printed circuit board coupled to the front printed circuit board, the rear printed circuit board comprising the rear drive section;
the opening is a gap located between the front printed circuit board and the rear printed circuit board; and
the air baffle is:
    composed of rigid plastic;
    coupled to the front printed circuit board and the rear printed circuit board; and
    configured to rigidly tie the front printed circuit board to the rear printed circuit board.

18. A method comprising:
pulling out a storage-system drawer from a data-center rack, the storage-system drawer comprising:
    a chassis having a front, a left side, a right side, and a rear;
    a retaining member coupled to the chassis comprising
        a plurality of keyhole fasteners that are oriented downward relative to the chassis; and
    a removeable drive-plane board comprising:
        a plurality of keyhole openings that are interlocked with the plurality of keyhole fasteners of the retaining member;
        a storage-drive connector that connects a storage drive to the removeable drive-plane board;
        a storage-system module connector that connects a storage-system module to the removeable drive-plane board; and
        an opening through which a screw having a hand knob is removably engaging the retaining member and securing the removable drive-plane board to the retaining member;
unseating the storage drive from the storage-drive connector;
unseating the storage-system module from the storage-system module connector;
toollessly unscrewing the screw from the retaining member;
sliding the removable drive-plane board so that each of the plurality of keyhole fasteners of the retaining member disengages each of the plurality of keyhole openings of the removable drive-plane board; and
removing the removable drive-plane board from the chassis.

19. The method of claim 18, wherein:
the rear of the chassis comprises an additional retaining member configured to retain a rear edge of the removable drive-plane board when the plurality of keyhole openings of the removable drive-plane board are disengaged from the plurality of keyhole fasteners of the retaining member;
sliding the removable drive-plane board comprises sliding the removable drive-plane board rearward relative to the chassis until the rear edge of the removable drive-plane board contacts the additional retaining member;
removing the removable drive-plane board from the chassis comprises lowering a front edge of the removable drive-plane board until the plurality of keyhole fasteners of the retaining member are clear of the plurality of keyhole openings of the removable drive-plane board.

20. The method of claim 18, further comprising:
aligning a plurality of keyhole openings of a replacement drive-plane board with the plurality of keyhole fasteners of the retaining member;
lifting the replacement drive-plane board until the plurality of keyhole fasteners of the retaining member are inserted into the plurality of keyhole openings of the replacement drive-plane board;
sliding the replacement drive-plane board forward relative to the chassis until the plurality of keyhole openings of the replacement drive-plane board are interlocked with the plurality of keyhole fasteners of the retaining member;
screwing the screw into the retaining member;
seating the storage drive to a storage-drive connector of the replacement drive-plane board;
seating the storage-system module to a storage-system module connector of the replacement drive-plane board; and
pushing the storage-system drawer back into the data-center rack.

\* \* \* \* \*